United States Patent
Varghese et al.

(10) Patent No.: US 9,287,438 B1
(45) Date of Patent: Mar. 15, 2016

(54) METHOD FOR FORMING OHMIC N-CONTACTS AT LOW TEMPERATURE IN INVERTED METAMORPHIC MULTIJUNCTION SOLAR CELLS WITH CONTAMINANT ISOLATION

(71) Applicants: Tansen Varghese, Regensburg (DE); Arthur Cornfeld, Albuquerque, NM (US); Daniel McGlynn, Albuquerque, NM (US)

(72) Inventors: Tansen Varghese, Regensburg (DE); Arthur Cornfeld, Albuquerque, NM (US); Daniel McGlynn, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 600 days.

(21) Appl. No.: 13/754,730

(22) Filed: Jan. 30, 2013

Related U.S. Application Data

(63) Continuation-in-part of application No. 12/218,582, filed on Jul. 16, 2008, now abandoned.

(51) Int. Cl.
*H01L 31/18* (2006.01)
*H01L 31/0687* (2012.01)

(52) U.S. Cl.
CPC ........ *H01L 31/1844* (2013.01); *H01L 31/0687* (2013.01); *H01L 31/1864* (2013.01); *H01L 31/1892* (2013.01)

(58) Field of Classification Search
CPC ............ H01L 31/1844; H01L 31/1864; H01L 31/1892; H01L 31/0735; H01L 31/078
USPC .......................................................... 438/98
See application file for complete search history.

(56) References Cited

U.S. PATENT DOCUMENTS

| | | | | |
|---|---|---|---|---|
| 3,488,834 A | * | 1/1970 | Baird | H01L 21/00 148/DIG. 150 |
| 3,964,155 A | * | 6/1976 | Leinkram | H01L 31/042 136/246 |
| 4,001,864 A | * | 1/1977 | Gibbons | H01L 31/068 136/255 |
| 4,011,583 A | * | 3/1977 | Levinstein | H01L 21/28575 148/DIG. 18 |
| 4,173,495 A | * | 11/1979 | Rapp | H01L 31/055 136/247 |
| 4,255,211 A | * | 3/1981 | Fraas | H01L 31/0687 136/249 |
| 4,338,480 A | * | 7/1982 | Antypas | H01L 31/043 136/249 |
| 4,393,576 A | * | 7/1983 | Dahlberg | H01L 21/283 136/244 |
| 4,612,408 A | * | 9/1986 | Moddel | H01L 27/14643 136/244 |
| 4,881,979 A | * | 11/1989 | Lewis | H01L 31/0687 117/89 |

(Continued)

FOREIGN PATENT DOCUMENTS

| EP | 1109230 | 6/2001 |
|---|---|---|
| EP | 1863099 | 12/2007 |

(Continued)

OTHER PUBLICATIONS

U.S. Appl. No. 12/265,113, filed Nov. 5, 2008, Varghese.

(Continued)

*Primary Examiner* — Earl Taylor

(57) ABSTRACT

A method of manufacturing a solar cell assembly by providing a first substrate; depositing on the first substrate a sequence of layers of semiconductor material forming a solar cell; mounting a supporting member on top of the sequence of layers using a temporary adhesive bonding material to form a processing assembly; removing the first substrate; and depositing a contact layer including germanium and palladium on the top surface of the solar cell at a relatively low temperature so that the temporary adhesive allows the processing assembly to remain attached.

19 Claims, 29 Drawing Sheets

(56) References Cited

U.S. PATENT DOCUMENTS

| | | | |
|---|---|---|---|
| 5,011,782 A * | 4/1991 | Lamb | H01L 31/02168 136/255 |
| 5,019,177 A * | 5/1991 | Wanlass | H01L 31/03046 117/89 |
| 5,021,360 A * | 6/1991 | Melman | B82Y 20/00 117/105 |
| 5,053,083 A * | 10/1991 | Sinton | H01L 31/03529 136/255 |
| 5,100,835 A * | 3/1992 | Zheng | H01L 21/28575 148/DIG. 20 |
| 5,217,539 A * | 6/1993 | Fraas | H01L 31/03042 136/246 |
| 5,246,506 A * | 9/1993 | Arya | H01L 31/03765 136/249 |
| 5,322,572 A * | 6/1994 | Wanlass | H01L 31/03046 136/246 |
| 5,342,453 A * | 8/1994 | Olson | H01L 31/02168 136/262 |
| 5,376,185 A * | 12/1994 | Wanlass | H01L 31/02168 136/262 |
| 5,479,032 A * | 12/1995 | Forrest | H01L 31/0352 257/184 |
| 5,510,272 A * | 4/1996 | Morikawa | H01L 31/035281 136/244 |
| 5,944,913 A * | 8/1999 | Hou | H01L 31/02167 136/255 |
| 5,980,785 A * | 11/1999 | Xi | C08K 3/0008 252/500 |
| 6,165,873 A * | 12/2000 | Hamada | H01L 21/304 257/347 |
| 6,180,432 B1 | 1/2001 | Freeouf | |
| 6,239,354 B1 * | 5/2001 | Wanlass | H01L 27/142 136/244 |
| 6,252,287 B1 * | 6/2001 | Kurtz | H01L 31/0725 136/252 |
| 6,281,426 B1 * | 8/2001 | Olson | H01L 31/03046 136/249 |
| 6,300,557 B1 * | 10/2001 | Wanlass | H01L 31/0735 136/244 |
| 6,300,558 B1 * | 10/2001 | Takamoto | H01L 31/0735 136/249 |
| 6,340,788 B1 * | 1/2002 | King | H01J 37/3023 136/255 |
| 6,482,672 B1 * | 11/2002 | Hoffman | H01L 31/03046 117/954 |
| 6,660,928 B1 * | 12/2003 | Patton | H01L 31/0687 136/249 |
| 6,690,041 B2 * | 2/2004 | Armstrong | H01L 31/02021 257/184 |
| 6,716,657 B1 * | 4/2004 | Soh | B81B 7/0006 438/29 |
| 6,778,304 B1 * | 8/2004 | Muller | B81B 3/0016 359/200.6 |
| 6,951,819 B2 * | 10/2005 | Iles | H01L 31/0687 438/705 |
| 7,071,407 B2 * | 7/2006 | Faterni | H01L 31/03046 136/255 |
| 7,166,520 B1 * | 1/2007 | Henley | H01L 21/2007 257/E21.122 |
| 7,727,795 B2 | 6/2010 | Stan et al. | |
| 7,741,146 B2 * | 6/2010 | Cornfeld | H01L 31/06875 257/E21.125 |
| 7,785,989 B2 * | 8/2010 | Sharps | H01L 29/045 257/E21.124 |
| 7,842,881 B2 * | 11/2010 | Cornfeld | H01L 27/142 136/261 |
| 7,960,201 B2 | 6/2011 | Cornfeld et al. | |
| 7,964,789 B2 * | 6/2011 | Posthuma | H01L 31/02161 136/261 |
| 8,039,291 B2 | 10/2011 | Cornfeld et al. | |
| 8,187,907 B1 | 5/2012 | Newman | |
| 8,236,600 B2 | 8/2012 | Cornfeld | |
| 8,263,853 B2 | 9/2012 | Varghese | |
| 8,378,281 B2 | 2/2013 | Kats et al. | |
| 8,513,518 B2 | 8/2013 | McGlynn et al. | |
| 8,536,445 B2 | 9/2013 | Cornfeld et al. | |
| 8,753,918 B2 | 6/2014 | Varghese et al. | |
| 9,018,519 B1 | 4/2015 | Cornfeld et al. | |
| 9,018,521 B1 | 4/2015 | Cornfeld | |
| 9,117,966 B2 | 8/2015 | Cornfeld et al. | |
| 2002/0117675 A1 * | 8/2002 | Mascarenhas | H01L 29/167 257/87 |
| 2003/0226952 A1 * | 12/2003 | Clark | H01L 31/02027 250/214.1 |
| 2004/0009624 A1 * | 1/2004 | Gormley | G02B 26/0841 438/50 |
| 2004/0079408 A1 * | 4/2004 | Fetzer | H01L 31/184 136/262 |
| 2004/0166681 A1 | 8/2004 | Iles et al. | |
| 2004/0200523 A1 * | 10/2004 | King | H01L 31/036 136/262 |
| 2004/0245645 A1 * | 12/2004 | Miyamoto | H01L 23/5226 257/758 |
| 2005/0059217 A1 * | 3/2005 | Morrow | H01L 21/76898 438/455 |
| 2005/0117194 A1 * | 6/2005 | Kim | B82Y 20/00 359/273 |
| 2005/0146765 A1 * | 7/2005 | Turner | G02B 7/1821 359/224.1 |
| 2005/0211291 A1 * | 9/2005 | Bianchi | H01L 31/022466 136/255 |
| 2005/0263183 A1 * | 12/2005 | Nishikitani | B82Y 10/00 136/263 |
| 2005/0274409 A1 * | 12/2005 | Fetzer | H01L 31/0687 136/249 |
| 2005/0274411 A1 * | 12/2005 | King | H01L 31/0687 136/256 |
| 2006/0021565 A1 * | 2/2006 | Zahler | C30B 23/02 117/89 |
| 2006/0112986 A1 * | 6/2006 | Atwater, Jr. | H01L 31/0687 136/255 |
| 2006/0144435 A1 * | 7/2006 | Wanlass | H01L 31/06875 136/249 |
| 2006/0162768 A1 * | 7/2006 | Wanlass | H01L 31/06875 136/262 |
| 2006/0185582 A1 * | 8/2006 | Atwater, Jr. | C30B 33/06 117/89 |
| 2006/0207651 A1 * | 9/2006 | Posthuma | H01L 31/022425 136/261 |
| 2006/0219167 A1 * | 10/2006 | Cheng | H01L 21/324 118/715 |
| 2007/0020926 A1 * | 1/2007 | Kalvesten | B81B 7/0006 438/667 |
| 2007/0057339 A1 * | 3/2007 | Mitsui | H01L 27/14647 257/432 |
| 2007/0091414 A1 * | 4/2007 | Yang | G02B 26/0841 359/291 |
| 2007/0137694 A1 * | 6/2007 | Foster | H01L 31/02168 136/255 |
| 2007/0145591 A1 * | 6/2007 | Yano | H01L 21/76805 257/758 |
| 2007/0218649 A1 * | 9/2007 | Hernandez | H01L 21/6835 438/458 |
| 2007/0277873 A1 * | 12/2007 | Cornfeld | H01L 31/03046 136/255 |
| 2008/0012147 A1 * | 1/2008 | Watanabe | H01L 23/522 257/774 |
| 2008/0029151 A1 * | 2/2008 | McGlynn | H01L 31/052 136/249 |
| 2008/0149173 A1 * | 6/2008 | Sharps | H01L 31/0443 136/255 |
| 2008/0185038 A1 * | 8/2008 | Sharps | H01L 31/022425 136/255 |
| 2008/0245409 A1 * | 10/2008 | Varghese | H01L 31/06875 136/256 |
| 2009/0038679 A1 * | 2/2009 | Varghese | H01L 31/022433 136/262 |
| 2009/0078308 A1 * | 3/2009 | Varghese | H01L 31/06875 136/255 |
| 2009/0078309 A1 * | 3/2009 | Cornfeld | H01L 31/022425 136/255 |
| 2009/0078310 A1 * | 3/2009 | Stan | H01L 31/03529 136/255 |

(56) References Cited

U.S. PATENT DOCUMENTS

| | | | |
|---|---|---|---|
| 2009/0078311 A1* | 3/2009 | Stan | H01L 31/022425 136/255 |
| 2009/0155952 A1* | 6/2009 | Stan | H01L 31/03042 438/94 |
| 2009/0188546 A1 | 7/2009 | McGlynn et al. | |
| 2009/0223554 A1* | 9/2009 | Sharps | B64G 1/443 136/246 |
| 2009/0229658 A1* | 9/2009 | Stan | H01L 31/06875 136/255 |
| 2009/0229662 A1* | 9/2009 | Stan | H01L 31/06875 136/261 |
| 2009/0272430 A1* | 11/2009 | Cornfeld | H01L 31/02168 136/255 |
| 2009/0272438 A1* | 11/2009 | Cornfeld | H01L 31/022425 136/261 |
| 2009/0288703 A1* | 11/2009 | Stan | H01L 31/06875 136/255 |
| 2009/0314348 A1 | 12/2009 | McGlynn et al. | |
| 2010/0012174 A1* | 1/2010 | Varghese | H01L 31/06875 136/255 |
| 2010/0012175 A1* | 1/2010 | Varghese | H01L 31/022425 136/255 |
| 2010/0031994 A1* | 2/2010 | Varghese | H01L 31/022425 136/244 |
| 2010/0047959 A1* | 2/2010 | Cornfeld | H01L 31/06875 438/94 |
| 2010/0093127 A1* | 4/2010 | Sharps | H01L 31/022425 438/64 |
| 2010/0116327 A1* | 5/2010 | Cornfeld | H01L 31/06875 136/255 |
| 2010/0122724 A1* | 5/2010 | Cornfeld | H01L 31/06875 136/255 |
| 2010/0122764 A1* | 5/2010 | Newman | H01L 31/022425 156/247 |
| 2010/0147366 A1* | 6/2010 | Stan | H01L 31/06875 136/255 |
| 2010/0186804 A1* | 7/2010 | Cornfeld | H01L 31/02021 136/255 |
| 2010/0203730 A1* | 8/2010 | Cornfeld | H01L 31/06875 438/694 |
| 2010/0206365 A1* | 8/2010 | Chumney | H01L 31/06875 136/255 |
| 2010/0229913 A1* | 9/2010 | Cornfeld | H01L 31/06875 136/244 |
| 2010/0229926 A1* | 9/2010 | Newman | H01L 31/06875 136/255 |
| 2010/0229932 A1 | 9/2010 | Cornfeld et al. | |
| 2010/0229933 A1* | 9/2010 | Cornfeld | H01L 31/06875 136/256 |
| 2010/0233838 A1* | 9/2010 | Varghese | H01L 21/6835 438/64 |
| 2010/0233839 A1* | 9/2010 | Cornfeld | H01L 31/022425 438/66 |
| 2010/0236615 A1 | 9/2010 | Sharps | |
| 2010/0248411 A1 | 9/2010 | Cornfeld et al. | |
| 2010/0282288 A1* | 11/2010 | Cornfeld | H01L 31/02008 136/244 |
| 2011/0030774 A1* | 2/2011 | Cornfeld | H01L 31/022441 136/256 |
| 2011/0041898 A1* | 2/2011 | Cornfeld | H01L 31/02 136/255 |
| 2012/0132250 A1 | 5/2012 | Cornfeld | |
| 2012/0211047 A1 | 8/2012 | Cornfeld | |

FOREIGN PATENT DOCUMENTS

| | | |
|---|---|---|
| EP | 0658944 | 4/2009 |
| FR | 2878076 A1 | 5/2006 |
| WO | WO 2005/015638 A1 | 2/2005 |

OTHER PUBLICATIONS

U.S. Appl. No. 12/708,361, filed Feb. 18, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/813,408, filed Jun. 10, 2010, Patel.
U.S. Appl. No. 12/844,673, filed Jul. 27, 2010, Stan.
U.S. Appl. No. 13/569,794, filed Aug. 8, 2012, Stan.
U.S. Appl. No. 13/604,883, filed Sep. 6, 2012, Tourino.
Aiken et al., "Consideration of High Bandgap Subcells for Advanced Multijunction Solar Cells," Conference Record of 2006 IEEE $4^{th}$ World Conference on Photovoltaic Energy Conversion, May 1, 2006; pp. 838-841.
Aina et al., "Low-temperature sintered AuGe/GaAs ohmic contact," *J. Appl. Phys.*, 1982; 53(1):777-780.
Cornfeld et al., "Development of a Large Area Inverted Metamorphic Multi-junction Highly Efficient AM0 Solar Cell," Conference paper presented at the $33^{rd}$ IEEE Photovoltaic Specialists Conference (May 11-16, 2008) on May 12, 2008. San Diego, CA, USA; 17 pgs.
Cornfeld et al., "Development of a Large Area Inverted Metamorphic Multi-Junction (IMM) Highly Efficient AM0 Solar Cell," $33^{rd}$ IEEE Photovoltaic Specialists Conference, May 11-16, 2008, San Diego, CA, USA; 5 pgs.
Cornfeld et al., "Advances in the Performance of Inverted Metamorphic Multi-junction Solar Cells," $23^{rd}$ European Photovoltaic Energy Conference, Aug. 29, 2008, Valencia, Spain; 11 pgs.
Friedman et al., "0.7-eV GaInAs Junction for a GaInP/GaAs/GaInAs(1eV)/GaInAs(0.7eV) Four-Junction Solar Cell," 2006 IEEE $4^{th}$ World Conference on Photovoltaic Energy Conversion, May 7-12, 2006, Waikoloa, Hawaii, USA; pp. 598-602.
Geisz et al., "High efficiency GaInP/GaAs/InGaAs triple junction solar cells grown inverted with a metamorphic bottom junction," *Applied Physics Letters*, 2007; 91:023502-1-023502-3.
Geisz et al., "Inverted GaInP / (In)GaAs Triple-Junction Solar Cells with Low-Stress Metamorphic Bottom Junctions," 33rd IEEE Photovoltaic Specialists Conference, May 11-16, 2008, San Diego, CA, USA; 5 pgs.
King et al., "Next-Generation, High Efficiency III-V Multijunction Solar Cells," $28^{th}$ IEEE Photovoltaic Specialists Conference, Sep. 15-22, 2000, Anchorage, AK, USA; pp. 998-1001.
King et al., "High-Efficiency Space and Terrestrial Multijunction Solar Cells Through Bandgap Control in Cell Structures," 2002 Photovoltaic Specialists Conference, Conference Record of the $29^{th}$ IEEE, May 19-24, 2002, New Orleans, LA, USA; pp. 776-781.
Lewis et al., "The Crystallographic Connection of MOCVD-Grown Monolithic Cascade Subcells Via Transparent Graded Layers," *Journal of Crystal Growth*, 1984; 69:515-526.
Lewis et al., "Recent Developments in Multijuction Solar Cell Research," *Solar Cells*, 1988; 24:171-183.
Marshall et al., "Nonalloyed ohmic contacts to *n*-GaAs by solid-phase epitaxy of Ge," *J. Appl. Phys.*, Aug. 1987; 62(3):942-947.
Piotrowska et al., "Ohmic Contacts to III-V Compound Semiconductors: A Review of Fabrication Techniques," *Solid State Electronics*, 1983; 26(3):179-197.
Schultz et al., High Efficiency 1.0-eV GaInAs Bottom Solar Cell for 3-junction Monolithic Stack, Conference Record of the $21^{st}$ IEEE Photovoltaic Specialists Conference, May 21-25, 1990, Kissimmee, FL, USA; pp. 148-152.
Sexl et al., "MBE Growth of Metamorphic In(Ga)AlAs Buffers," 1997 IEEE International Symposium on Compound Semiconductors, Sep. 8-11, 1997; pp. 49-52.
Sharps et al., "Inverting the triple junction improves efficiency and flexibility," *Compound Semiconductor*, Oct. 2007; pp. 25-28.
Sinharoy et al., "Progress in the Development of Metamorphic Multi-junction III-V Space Solar Cells," *Progress in Photovoltaics: Research and Applications*, Feb. 2002; 10:427-432.
Stan et al., "Very High Efficiency Triple Junction Solar Cells by MOVPE," $14^{th}$ International Conference of Metalorganic Vapor Phase Epitaxy, Jun. 5, 2008, Metz, France; 32 pgs.
Stan et al, "High-efficiency quadruple junction solar cells using OMVPE with inverted metamorphic device structures," *Journal of Crystal Growth*, 2010; 312:1370-1374.
Takamoto et al., "Future Development of InGaP/(In)GaAs Based Multijunction Solar Cells," Proceedings of the $31^{st}$ IEEE PVSC, Jan. 3-7, 2005, pp. 519-524, Lake Buena Vista, FL.

(56) References Cited

OTHER PUBLICATIONS

Takamoto et al., "InGaP/GaAs-based Multijunction Solar Cells," *Progress in Photovoltaics: Research and Applications*, 2005; 13:495-511.

Venkatasubramanian et al., "An Inverted-Growth Approach to Development of an IR-Transparent, High-Efficiency AlGaAs/GaAs Cascade Solar Cell," 22$^{nd}$ IEEE Photovoltaic Specialists Conference, Oct. 7-11, 1991, Las Vegas, NV, USA; pp. 93-98.

Venkatasubramanian et al., "High-quality eutectic-metal-bonded AlGaAs-GaAs thin films on Si substrates," *Applied Physics Letters*, 1992; 60(7):886-888.

Wanlass et al., "Lattice-Mismatched Approaches for High-Performance, III-V Photovoltaic Energy Converters," *Conference Proceedings of the 31$^{st}$ IEEE Photovoltaic Specialists Conference and Exhibition*, Jan. 3-7, 2005; Lake Buena Vista, FL, USA, pp. 530-535.

Wanlass et al., "Monolithic, Ultra-Thin GaInP/GaAs/GaInAs Tandem Solar Cells," 2006 IEEE 4$^{th}$ World Conference on Photovoltaic Energy Conversion, May 7-12, 2006, Waikoloa, Hawaii, USA; pp. 729-732.

Wurfel, ed., Physics of Solar Cells: from Basic Principles to Advanced Concepts, Second, Updated and Expanded Edition, 2009, Wiley-VCH, Weinheim, Germany; Sections 6.4, 6.5 and 6.8; 20 pages.

Yamaguchi, "Physics and Technologies of Superhigh-Efficiency Tandem Solar Cells," *Semiconductors*, Sep. 1999; 33(9):961-964.

Yoon et al., "Progress of Inverted Metamorphic III-V Solar Cell Development at Spectrolab," 33$^{rd}$ IEEE Photovoltaic Specialists Conference, May 11-16, 2008, San Diego, CA, USA; 6 pgs.

Office Action mailed Jan. 4, 2011. U.S. Appl. No. 11/445,793. (Sexl reference, double patenting rejection); 46 pgs.

Advisory Action mailed Mar. 15, 2011. U.S. Appl. No. 11/445,793; 5 pgs.

Office Action mailed Nov. 8, 2010 (double patenting rejection). U.S. Appl. No. 12/047,842; 29 pgs.

Partial European Search Report, Application No. EP 08013466. Feb. 12, 2009. European Patent Office, Berlin, Germany; 1 pg.

European Search Report, Application No. EP 06024750, Oct. 26, 2012; 4 pgs.

* cited by examiner

METHOD FOR FORMING OHMIC N-CONTACTS AT LOW TEMPERATURE IN INVERTED METAMORPHIC MULTIJUNCTION SOLAR CELLS WITH CONTAMINANT ISOLATION

REFERENCE TO RELATED APPLICATIONS

This application is a continuation-in-part of co-pending U.S. patent application Ser. No. 12/218,582, filed Jul. 16, 2008, and is related to U.S. patent application Ser. No. 13/603,088, filed Sep. 4, 2012, which is a divisional of U.S. patent application Ser. No. 12/218,582, filed Jul. 16, 2008.

This application is related to co-pending U.S. patent application Ser. No. 13/604,883, filed Sep. 6, 2012, which is a continuation-in-part of U.S. patent application Ser. No. 12/637,241, filed Dec. 14, 2009, which in turn is a continuation-in-part of U.S. patent application Ser. No. 11/616,596, filed Dec. 27, 2006, and Ser. No. 12/544,001, filed Aug. 19, 2009.

This application is related to co-pending U.S. patent application Ser. No. 13/569,794 filed Aug. 9, 2012.

This application is related to co-pending U.S. patent application Ser. No. 13/547,334 filed Jul. 12, 2012.

This application is related to co-pending U.S. patent application Ser. No. 13/440,331 filed Apr. 15, 2012.

This application is related to co-pending U.S. patent application Ser. No. 13/401,181 filed Feb. 21, 2012.

This application is related to co-pending U.S. patent application Ser. No. 13/315,877, filed Dec. 9, 2011, which is in turn is a continuation of U.S. patent application Ser. No. 12/362,213, filed on Jan. 29, 2009, and which is in turn is a continuation-in-part of co-pending U.S. patent application Ser. No. 11/445,793, filed Jun. 2, 2006.

This application is related to co-pending U.S. patent application Ser. No. 12/844,673, filed Jul. 27, 2010, which is in turn a continuation-in-part of co-pending U.S. patent application Ser. No. 11/860,142, filed Sep. 24, 2007.

This application is related to co-pending U.S. patent application Ser. No. 12/813,408 filed Jun. 10, 2010.

This application is related to co-pending U.S. patent application Ser. No. 12/775,946 filed May 7, 2010.

This application is related to co-pending U.S. patent application Ser. No. 12/756,926, filed Apr. 8, 2010.

This application is related to co-pending U.S. patent application Ser. No. 12/730,018, filed Mar. 23, 2010.

This application is related to co-pending U.S. patent application Ser. No. 12/716,814, filed Mar. 3, 2010.

This application is related to co-pending U.S. patent application Ser. No. 12/708,361, filed Feb. 18, 2010.

This application is related to co-pending U.S. patent application Ser. No. 12/637,241, filed Dec. 14, 2009.

This application is related to co-pending U.S. patent application Ser. No. 12/623,134, filed Nov. 20, 2009.

This application is related to co-pending U.S. patent application Ser. No. 12/544,001, filed Aug. 19, 2009.

This application is related to co-pending U.S. patent application Ser. Nos. 12/401,137, 12/401,157, and 12/401,189, filed Mar. 10, 2009.

This application is related to co-pending U.S. patent application Ser. No. 12/362,201, now U.S. Pat. No. 7,960,201; Ser. No. 12/362,213; and Ser. No. 12/362,225, filed Jan. 29, 2009.

This application is related to co-pending U.S. patent application Ser. No. 12/337,014 filed Dec. 17, 2008, now U.S. Pat. No. 7,785,989.

This application is related to co-pending U.S. patent application Ser. No. 12/271,127 and Ser. No. 12/271,192 filed Nov. 14, 2008.

This application is related to U.S. patent application Ser. No. 12/267,812 filed Nov. 10, 2008, now U.S. Pat. No. 8,236,600.

This application is related to co-pending U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to co-pending U.S. patent application Ser. No. 12/187,477, filed Aug. 7, 2008.

This application is related to co-pending U.S. patent application Ser. No. 12/218,558 and U.S. patent application Ser. No. 12/218,582 filed Jul. 16, 2008.

This application is related to co-pending U.S. patent application Ser. No. 12/123,864 filed May 20, 2008.

This application is related to co-pending U.S. patent application Ser. No. 12/023,772, filed Jan. 31, 2008.

This application is related to U.S. patent application Ser. No. 11/956,069, filed Dec. 13, 2007, and its divisional application Ser. No. 12/187,454 filed Aug. 7, 2008, now U.S. Pat. No. 7,727,795;

This application is also related to co-pending U.S. patent application Ser. Nos. 11/860,142 and 11/860,183 filed Sep. 24, 2007.

This application is also related to co-pending U.S. patent application Ser. No. 11/445,793 filed Jun. 2, 2006.

This application is also related to co-pending U.S. patent application Ser. No. 11/500,053 filed Aug. 7, 2006, and its divisional application Ser. No. 12/417,367 filed Apr. 2, 2009.

GOVERNMENT RIGHTS STATEMENT

This invention was made with government support under, inter alia, Contract No. FA9453-06-C-0345 awarded by the U.S. Air Force. The Government has certain rights in the invention.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Some embodiments of such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

SUMMARY OF THE INVENTION

Briefly, and in general terms, the present disclosure provides a method of manufacturing a solar cell comprising: providing a first semiconductor substrate; depositing on a first substrate an epitaxial sequence of layers of semiconductor material forming a solar cell using an MOCVD reactor; mounting a supporting member on top of the sequence of layers using a bonding material to form a processing assembly; removing the first substrate; depositing a contact layer including germanium and palladium on the top surface of the solar cell, said contact having a resistance of less than $5 \times 10^{-4}$ ohms-cm$^2$; lithographically patterning the metal contact layer to form a plurality of metal grid lines disposed on the top surface of the solar cell, including at least one metal contact pad electrically connected to said grid lines and disposed adjacent to a first peripheral edge of said first solar subcell; supporting the processing assembly on a contaminant isolation envelope so that during the subsequent annealing process when the adhesive tends to liquefy, the substrate and the supporting member do not become detached; and annealing the assembly at a temperature of at least 205 degrees C. wherein the substrate and the supporting member do not become detached.

In some embodiments, the depositing an epitaxial sequence of layers comprises forming a first subcell on said substrate with a first semiconductor material with a first band gap and a first lattice constant forming a second subcell comprising a second semiconductor material with a second band gap and a second lattice constant, wherein the second band gap is less than the first band gap and the second lattice constant is greater than the first lattice constant; and forming a lattice constant transition material positioned between the first subcell and the second subcell, said lattice constant transition material having a lattice constant that changes gradually from the first lattice constant to the second lattice constant.

In some embodiments, the first subcell is composed of an GaInP, GaAs, GaInAs, GaAsSb, or GaInAsN emitter region and an GaAs, GaInAs, GaAsSb, or GaInAsN base region.

In some embodiments, the second subcell is composed of an InGaAs base and emitter regions.

In some embodiments, the transition material is composed of any of the As, N, Sb based III-V compound semiconductors subject to constraints of having an in-plane lattice parameter greater or equal to that of the first subcell and less than or equal to that of the second subcell, and having a band gap energy greater than that of the first subcell.

In some embodiments, the transition material is composed of $(In_xGa_{1-x})_yAl_{1-y}As$, where $0<x<1$ and $0<y<1$, and with x and y selected such that the band gap of the transition material remains constant at a band gap energy greater than that of said first subcell.

In some embodiments, the band gap of the transition material remains constant at approximately 1.50 eV.

In some embodiments, the contact is sintered for approximately 35 minutes or less.

In some embodiments, the contact is a Pd/Ge/Ti/Pd/Au sequence of layers.

In some embodiments, the envelope is a flexible fabric.

In some embodiments, the fabric is composed of cotton.

In some embodiments, the envelope is a sheet of material.

In some embodiments, the envelope is a concave sheet encapsulating at least a portion of the bottom and sides of the assembly In some embodiments, the contact resistance is approximately $1 \times 10^{-4}$ ohms-cm$^2$.

In some embodiments, the mounting step includes adhering the solar cell to the surrogate substrate using an adhesive which is dissolvable in a solvent.

In some embodiments, the surrogate substrate is selected from the group of sapphire, Ge, GaAs, or silicon.

In some embodiments, the solar cell is eutectically bonded to the surrogate substrate.

In another aspect, the present disclosure uses the steps of mounting the solar cell on a support; and removing the surrogate substrate.

In some embodiments, the support is a rigid cover glass.

In some embodiments, the first substrate is removed by grinding the first substrate to remove over 80% of its thickness, followed by an etching step to remove the remaining portion of the first substrate.

In some embodiments, the first substrate is composed of GaAs.

In some embodiments, the first solar subcell is composed of an InGa(Al)P emitter region and an InGa(Al)P base region.

In some embodiments, the second solar subcell is composed of an InGaP emitter region and a GaAs base region.

In some embodiments, the third solar subcell is composed in InGaAs.

In some embodiments, the rigid cover glass includes a ceria glass having a thickness of about 4 mils.

In some embodiments, the disclosure further comprises a plurality of metal grid lines disposed on the top surface of the first solar subcell beneath the first glass member, including at least one metal contact pad electrically connected to said grid lines and disposed adjacent to a first peripheral edge of said first solar subcell; a metal contact layer adjacent to said third solar subcell beneath the second glass member for making an electrical contact to the third solar subcell; and a cut-out extending from a second peripheral edge of the solar cell opposite from said first edge and along the top surface of the solar cell to the metal contact layer.

Some implementations of the present invention may incorporate or implement fewer of the aspects and features noted in the foregoing summaries.

Additional aspects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1:
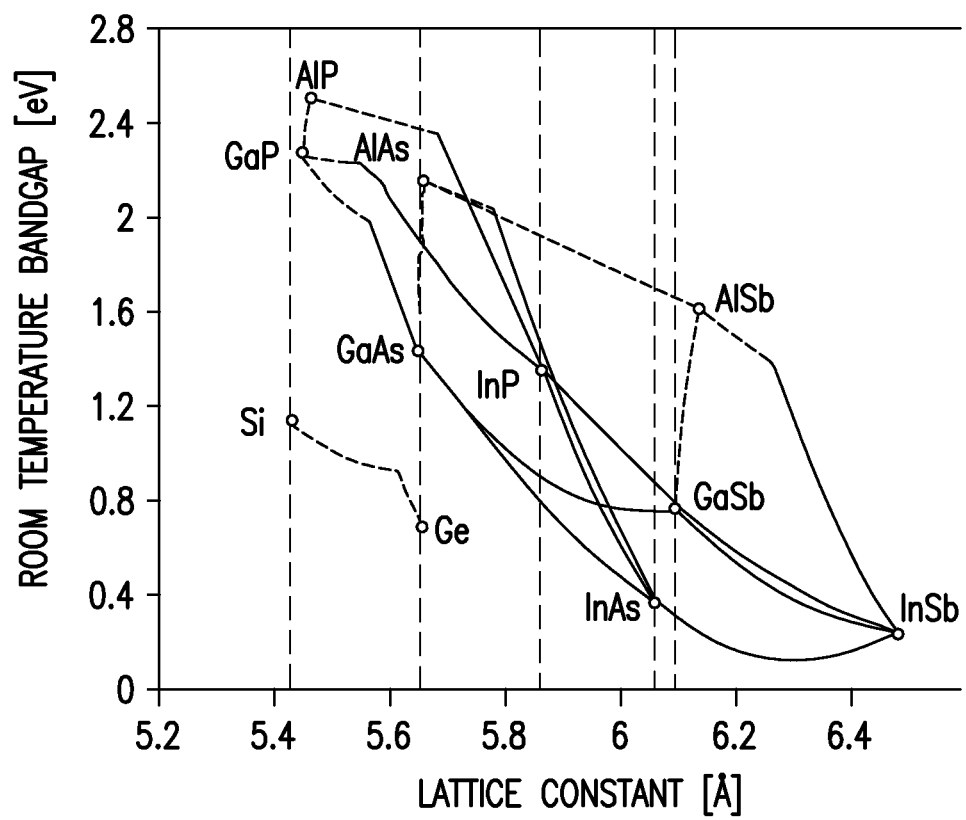
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are initially grown epitaxially directly on a semiconductor growth substrate, such as for example GaAs or Ge, and such subcells are consequently lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e., a band gap in the range of 0.7 to 1.2 eV). A back metal contact layer is then deposited. A surrogate substrate or support structure is then attached or provided over the "bottom" or substantially lattice-mismatched lower subcell, and the growth semiconductor substrate is subsequently removed. (The growth substrate may then subsequently be re-used for the growth of second and subsequent solar cells).

The present disclosure is directed to the composition of the metal contact used for the grid lines and bus bar on the top (sunward facing) side of the solar cell. As noted above, one aspect of fabrication of an IMM solar cell is the requirement for attachment to a surrogate substrate of support (also called a "handler") during fabrication. Such attachment is typically done by a temporary adhesive.

The temporary adhesive has a relatively low melting point of around 100° C. but maintains adhesion to somewhat greater than 200° C. These relatively low temperatures placed significant restriction on the alloy temperature for forming an ohmic contact especially to n-type GaAs with a Au—Ge eutectic based alloy with eutectic temperature of 361° C. Normal alloying temperature is ≥360° C. The production triple junction solar cell uses a 365° C. temperature to alloy simultaneously a Ti/Au/Ag to both the n and p-contact. These contacts are rather poor with specific contact resistivity of ≥1×10$^{-3}$'Ω-cm$^2$. Two contact metallizations have been considered to develop a lower temperature sintered contact: Au/Ge/Pd/Au and Pd/Ge/Ti/Pd/Au.

Initial investigation was done at 280° C. The Au/Ge based contact required a 60 min anneal (45 min anneal resulted in rectifying contact) to give a specific contact resistance of 3×10$^{-6}$'Ω-cm$^2$.

The Pd/Ge contact sintered for 5 min at 280° C. yielded an acceptable specific contact resistance of nominally 1×10$^{-4}$'Ω-cm$^{2.}$ The more reasonable sintering time for the required specific contact resistance (<1×10$^{-3}$'Ω-cm$^2$) motivated us to identify the Pd/Ge based metallization as optimum for our process. Moreover, the adhesive thermal property permitted lowering the sinter temperature to 205° C. At this low sinter temperature, a time of 35 min was required to achieve a specific contact resistance of 1×10$^{-4}$'Ω-cm$^2$.

A variety of different features and aspects of inverted metamorphic multijunction solar cells are disclosed in the related applications noted above. Some or all of such features may be included in the structures and processes associated with the solar cells of the present invention. More particularly, one aspect of the present application is directed to a semiconductor device, and the method of providing a flexible metallic film which is attached to the back metal layer on the semiconductor device. The back metal layer and/or the metallic film layer, may have a coefficient of thermal expansion that is approximately that of the adjacent semiconductor material. Neither, some or all of such aspects may be included in the structures and processes associated with the semiconductor devices and/or solar cells of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It should be apparent to one skilled in the art, that the inclusion of additional semiconductor layers within the cell with similar or additional functions and properties is also within the scope of the present invention.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
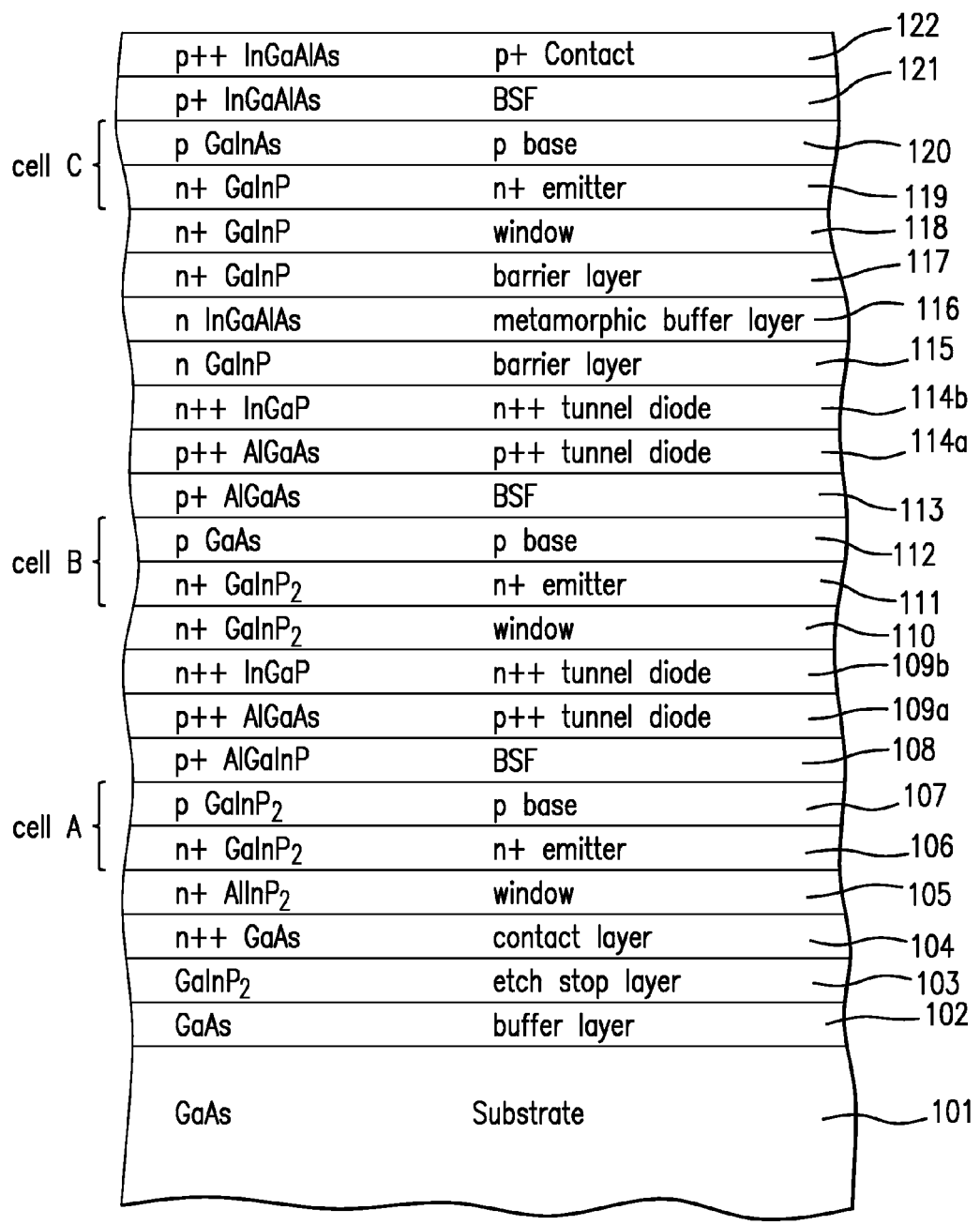
FIG. 2 is a cross-sectional view of the solar cell of the invention after the deposition of semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047, 944, filed Mar. 13, 2008. Other alternative growth substrates, such as described in U.S. patent application Ser. No. 12/337, 014 filed Dec. 17, 2008, may be used as well.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 15.

Subcell A will ultimately become the "top" subcell of the inverted metamorphic structure after completion of the process steps according to the present invention to be described hereinafter.

On top of the base layer 107 a back surface field ("BSF") layer 108 preferably p+AlGaInP is deposited and used to reduce recombination loss.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. patent application Ser. No. 12/258,190, filed Oct. 24, 2008. More generally, the window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to some embodiments of the present invention will be discussed in conjunction with FIG. 15.

In previously disclosed implementations of an inverted metamorphic solar cell, the middle cell was a homostructure. In some embodiments of the present invention, similarly to the structure disclosed in U.S. patent application Ser. No. 12/023,772, the middle subcell becomes a heterostructure with an InGaP emitter and its window is converted from InAlP to InGaP. This modification eliminated the refractive index discontinuity at the window/emitter interface of the middle sub-cell. Moreover, the window layer 110 is preferably doped three times that of the emitter 111 to move the Fermi level up closer to the conduction band and therefore create band bending at the window/emitter interface which results in constraining the minority carriers to the emitter layer.

In one of the embodiments of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps than the respective emitters. In summary, the advantages of the embodiments using heterojunction subcells are: (i) the short wavelength response for both subcells are improved, and (ii) the bulk of the radiation is more effectively absorbed and collected in the narrower band gap base. The overall effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

In some embodiments, barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells A and B, or in the direction of growth into the bottom subcell C, and is more particularly described in copending U.S. patent application Ser. No. 11/860,183, filed Sep. 24, 2007.

A metamorphic layer (or graded interlayer) 116 is deposited over the barrier layer 115 using a surfactant. Layer 116 is referred to as a graded interlayer since in some embodiments it is preferably a compositionally step-graded series of InGaAlAs layers, preferably with monotonically changing lattice constant in each step, so as to achieve a gradual transition in lattice constant in the semiconductor structure from the lattice constant of subcell B to the lattice constant of subcell C while minimizing threading dislocations from occurring. In some embodiments, the band gap of layer 116 is constant throughout its thickness, preferably approximately equal to 1.5 eV, or otherwise consistent with a value slightly greater than the base bandgap of the middle subcell B. In some embodiments, the graded interlayer may be composed of $(In_xGa_{1-x})_yAl_{1-y}As$, with $0<x<1$, $0<y<1$, and the values of x and y selected for each respective layer such that the band gap of the entire interlayer remains constant at approximately 1.50 eV or other appropriate band gap over its thickness.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the graded interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In one of the preferred embodiments of the present invention, the layer 116 is composed of a plurality of layers of InGaAlAs, with monotonically changing lattice constant, each layer having the same bandgap, approximately 1.5 eV.

The advantage of utilizing a constant bandgap material such as InGaAlAs over a phosphide based material is that arsenide-based semiconductor material is much easier to process in standard commercial MOCVD reactors, compared to phosphide materials, while the small amount of aluminum provides a bandgap that assures radiation transparency of the metamorphic layers.

Although one of the preferred embodiments of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

Since the present disclosure (and the related applications noted above) are directed to high volume manufacturing processes using metalorganic vapor phase epitaxy (MOVPE) reactors to form the solar cell epitaxial layers, a short discussion of some of the considerations associated with such processes and methods associated with the formation of the graded interlayer(s) are in order here.

First, it should be noted that the advantage of utilizing an interlayer material such as AlGaInAs is that arsenide-based semiconductor material is much easier to process from a manufacturing standpoint using present state-of-the-art high volume manufacturing metalorganic vapor phase epitaxy (MOVPE) reactors than either the AlGaInAsP, or GaInP compounds, or in general any material including phosphorus. Simply stated, the use of a III-V arsenide compound is much more desirable than a III-V phosphide compound from the perspectives of cost, ease of growth, reactor maintenance, waste handling and personal safety.

The cost advantage of the use of the AlGaInAs quaternary grading material relative to a GaInP ternary grading material, as an example, is a consequence of several factors. First, the use of a GaInP grading approach requires indium mole fractions of the order of 60% (i.e., the required material is $Ga_{0.4}In_{0.6}P$) whereas the use of the AlGaInAs quaternary requires only 15% indium (i.e., the required material is $Al_y(Ga_{0.85}In_{0.15})_{1-y}As$). In addition to the difference in the material itself, there is a further difference in the amount of precursor gases (trimethylgallium, trimethylindium, and arsine) that must be input to the reactor in order to achieve the desired composition. In particular, the ratio of the amount of precursor gases into the reactor to provide Group V elements, to the amount of precursor gases to provide Group III elements (such ratio being referred to as the "input V/III ratio") is typically five to ten times greater to produce a phosphide compound compared to producing an arsenide compound. As a illustrative quantification of the cost of producing a phosphide compound in a commercial operational MOPVE reactor process compared to the cost of producing an arsenide compound, Table 1 below presents the typical pro-forma costs of each element of the AlGaInAs and GaInP compounds for producing a graded interlayer of the type described in the present disclosure expressed on a per mole basis. Of course, like many commodities, the price of chemical compounds fluctuate from time to time and vary in different geographic locations and countries and from supplier to supplier. The prices used in Table 1 are representative for purchases in commercial quantities in the United States at the time of the present disclosure. The cost calculations make the assumption (typical for epitaxial processes using current commercial MOVPE reactors) that the input V/III ratios are 20 and 120 for the arsenide and phosphide compounds respectively. Such a choice of value of the ratio is merely illustrative for a typical process, and some processes may use even higher ratios for producing a graded interlayer of the type described in the present disclosure. The practical consequence of the inlet V/III ratio is that one will use 20 moles of As to one (1) mole of AlGaIn in the formation of the Applicant's quaternary material AlGaInAs, or 120 moles of P to 1 mole of GaIn in the formation of the interlayer using the ternary material GaInP. These assumptions along with the molar cost of each of the constituent elements indicate that the cost of fabrication of the AlGaInAs based grading interlayer will be approximately 25% of the cost of fabrication of a similar phosphide based grading interlayer. Thus, there is an important economic incentive from a commercial and manufacturing perspective to utilize an arsenide compound as opposed to a phosphide compound for the grading interlayer.

TABLE 1

Cost estimate of one mole of each of the AlGaInAs and GaInP grading layers

| Element | MW (gms) | $/gm | Cost/mole ($) | MF AlGaIn | Cost Molecular Mole of Al.17Ga.68In.15 | MF GaInP | Cost Molecular Mole of Ga.4In.6 |
|---|---|---|---|---|---|---|---|
| Al | 27 | 10.2 | 275.4 | 0.17 | 46.818 | 0 | 0 |
| Ga | 70 | 2.68 | 187.6 | 0.68 | 127.568 | 0.4 | 75.04 |
| In | 115 | 28.05 | 3225.75 | 0.15 | 483.8625 | 0.6 | 1935.45 |
| | | | Approx OM Cost/mole = | | 658.2485 | | 2010.49 |
| | Cost/mole ($) | V/III ratio | | | Cost/mole of Arsenic | | Cost/mole of phosphorus |
| AsH3 | $7.56 | 20 | $151.20 | | $151.20 | | |
| PH3 | $9.49 | 120 | $1,138.80 | | | | $1,138.54 |
| | | | Approx cost/molecular mole = | | $809.45 | | $3,149.03 |

The "ease of growth" of an arsenide compound as opposed to a phosphide compound for the grading interlayer in a high volume manufacturing environment is another important consideration and is closely related to issues of reactor maintenance, waste handling and personal safety. More particularly, in a high volume manufacturing environment the abatement differences between arsenide and phosphide based processes affect both cost and safety. The abatement of phosphorus is more time consuming, and hazardous than that required for arsenic. Each of these compounds builds up over time in the downstream gas flow portions of the MOVPE growth reactor. As such, periodic reactor maintenance for removal of these deposited materials is necessary to prevent adverse affects on the reactor flow dynamics, and thus the repeatability and uniformity of the epitaxial structures grown in the reactor. The difference in handling of these waste materials is significant. Arsenic as a compound is stable in air, non-flammable, and only represents a mild irritant upon skin contact. Phosphorus however, must be handled with considerably more care. Phosphorus is very flammable and produces toxic fumes upon burning and it is only moderately stable in air. Essentially the differences are manifest by the need for special handling and containment materials and procedures when handling phosphorus to prevent either combustion or toxic exposure to this material whereas using common personal protection equipment such as gloves, and a particle respirator easily accommodates the handling of arsenic.

Another consideration related to "ease of growth" that should be noted in connection with the advantages of a AlGaInAs based grading interlayer process compared to a AlGaInAsP compound derives from a frequently encountered issue when using an AlGaInAsP compound: the miscibility gap. A miscibility gap will occur if the enthalpy of mixing exceeds the entropy of mixing of two binary compounds AC and BC, where A, B and C are different elements. It is an established fact that the enthalpies of mixing of all ternary crystalline alloys of the form $A_xB_{1-x}C$, based upon the binary semiconductor forms AC and BC are positive leading to miscibility gaps in these compounds. See, for example, the discussion in reference [1] noted below. In this example, the letters A and B designate group III elements and letter C designates a group V element. As such, mixing of the binary compounds is said to occur on the group III sublattice. However, because OMVPE growth takes place under non-equilibrium conditions, the miscibility gap is not really a practical problem for accessing the entire ternary III-V semiconductor phase space. For the case of quaternary compounds of the form $A_xB_{1-x}C_yD_{1-y}$ where mixing of the binary alloys, AC, AD, BC, and BD occurs on both the group III and group V sublattices, the immiscibility problem is accentuated. Specifically for the GaP, InP, GaAs, InAs system, the region of immiscibility is quite large at growth temperatures appropriate for the OMVPE technique. See, for example, the discussion in reference [2] noted below. The resulting miscibility gap will prevent one from producing the requisite AlGaInAsP compounds needed for optical transparent grading of the IMM solar cell.

REFERENCES

V. A. Elyukhin, E. L. Portnoi, E. A. Avrutin, and J. H. Marsh, J. Crystal Growth 173 (1997) pp 69-72.

G. B. Stringfellow, Organometallic Vapor-Phase Epitaxy (Academic Press, New York 1989).

Figure 18:
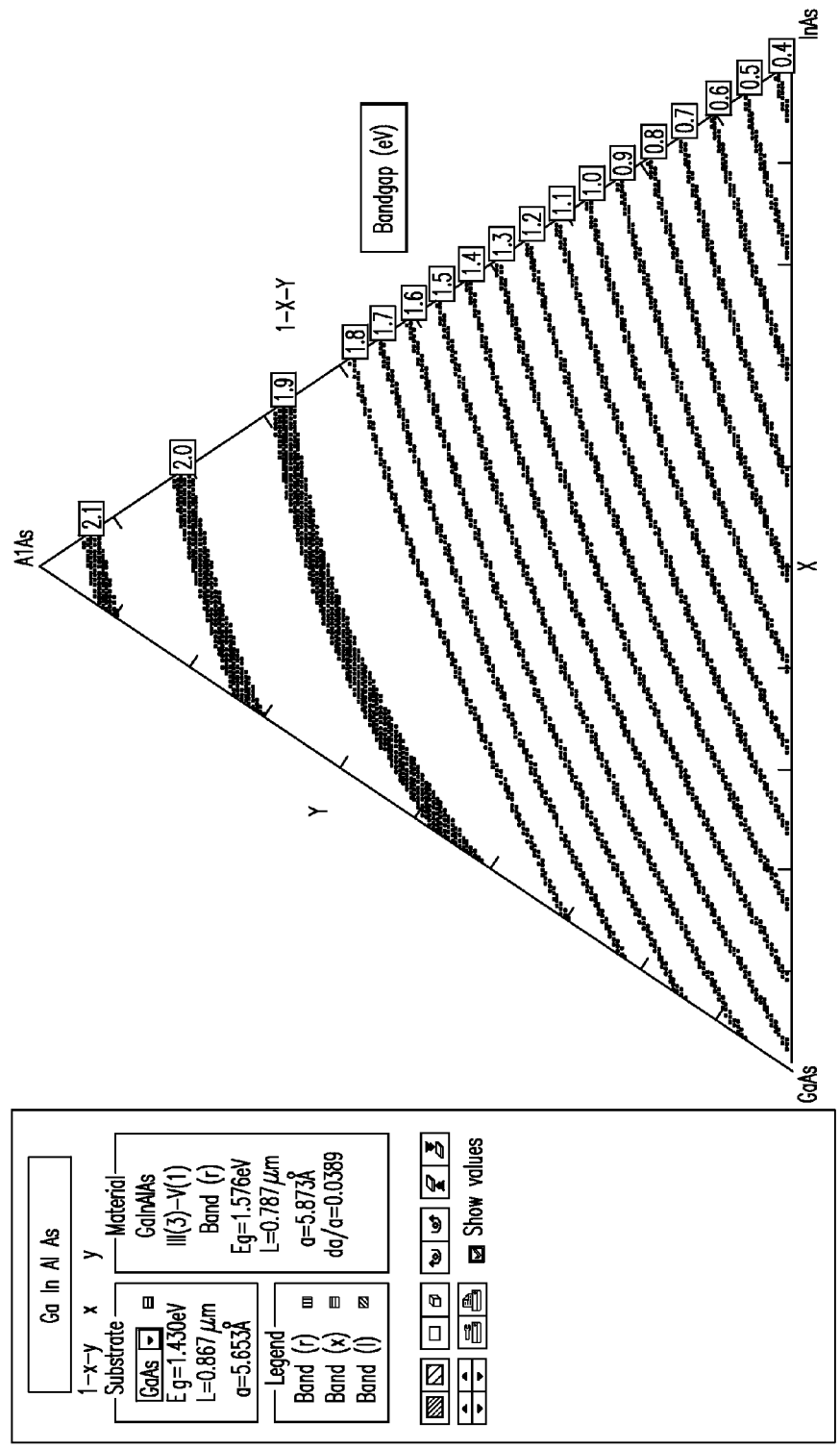
FIG. 18 is a diagram representing the relative concentration of Al, In, and Ga in an AlGaInAs material system needed to have a constant band gap with various designated values (ranging from 0.4 eV to 2.1 eV) as represented by curves on the diagram.

The fabrication of a step graded (or continuous graded) interlayer in an MOCVD process can be more explicitly described in a sequence of conceptual and operational steps which we describe here for pedagogical clarity. First, the appropriate band gap for the interlayer must be selected. In one of the disclosed embodiments, the desired constant band gap is 1.5 eV. Second, the most appropriate material system (i.e., the specific semiconductor elements to form a compound semiconductor alloy) must be identified. In the disclosed embodiment, these elements are Al, Ga, In, and As. Third, a computation must be made, for example using a computer program, to identify the class of compounds of $Al_y(Ga_xIn_{1-x})_{1-y}As$ for specific x and y that have a band gap of 1.5 eV. An example of such a computer program output that provides a very rough indication of these compounds is illustrated in FIG. 22. Fourth, based upon the lattice constants of the epitaxial layers adjoining the graded interlayer, a specification of the required lattice constants for the top surface of the interlayer (to match the adjacent semiconductor layer), and the bottom surface of the interlayer (to match the adjacent semiconductor layer) must be made. Fifth, based on the required lattice constants, the compounds of $Al_y(Ga_xIn_{1-x})_{1-y}$ As for specific x and y that have a band gap of 1.5 eV may be identified. Again, a computation must be made, and as an example, the data may be displayed in a graph such as FIG. 18 representing the Al, Ga and In mole fractions versus the Al to In mole fraction in a AlGaInAs material system that is necessary to achieve a constant 1.5 eV band gap. Assuming there is a small number (e.g. typically in the range of seven, eight, nine, ten, etc.) of steps or grades between the top surface and the bottom surface, and that the lattice constant difference between each step is made equal, the bold markings in FIG. 18 represent selected lattice constants for each successive sublayer in the interlayer, and the corresponding mole fraction of Al, Ga and In needed to achieve that lattice constant in that respective sublayer may be readily obtained by reference to the axes of the graph. Thus, based on an analysis of the data in FIG. 18, the reactor may be programmed to introduce the appropriate quantities of precursor gases (as determined by flow rates at certain timed intervals) into the reactor so as to achieve a desired specific $Al_y(Ga_xIn_{1-x})_{1-y}As$ composition in that sublayer so that each successive sublayer maintains the constant band gap of 1.5 eV and a monotonically increasing lattice constant. The execution of this sequence of steps, with calculated and determinate precursor gas composition, flow rate, temperature, and reactor time to achieve the growth of a $Al_y(Ga_xIn_{1-x})_{1-y}As$ composition of the interlayer with the desired properties (lattice constant change over thickness, constant band gap over the entire thickness), in a repeatable, manufacturable process, is not to be minimalized or trivialized.

Although one embodiment of the present disclosure utilizes a plurality of layers of AlGaInAs for the metamorphic layer 116 for reasons of manufacturability and radiation transparency, other embodiments of the present disclosure may utilize different material systems to achieve a change in lattice constant from subcell C to subcell D. Other embodiments of the present disclosure may utilize continuously graded, as opposed to step graded, materials. More generally, the graded interlayer may be composed of any of the As, N, Sb based III-V compound semiconductors subject to the constraints of having the in-plane lattice parameter greater or equal to that of the third solar cell and less than or equal to that of the fourth solar cell, and having a band gap energy greater than that of the third solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and p type InGaAs respectively, or n+ type InGaP and p type InGaAs for a heterojunction subcell, although another suitable materials consistent with lattice constant and bandgap requirements may be used as well. The doping profile of layers 119 and 120 will be discussed in connection with FIG. 15.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multijunction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 3:
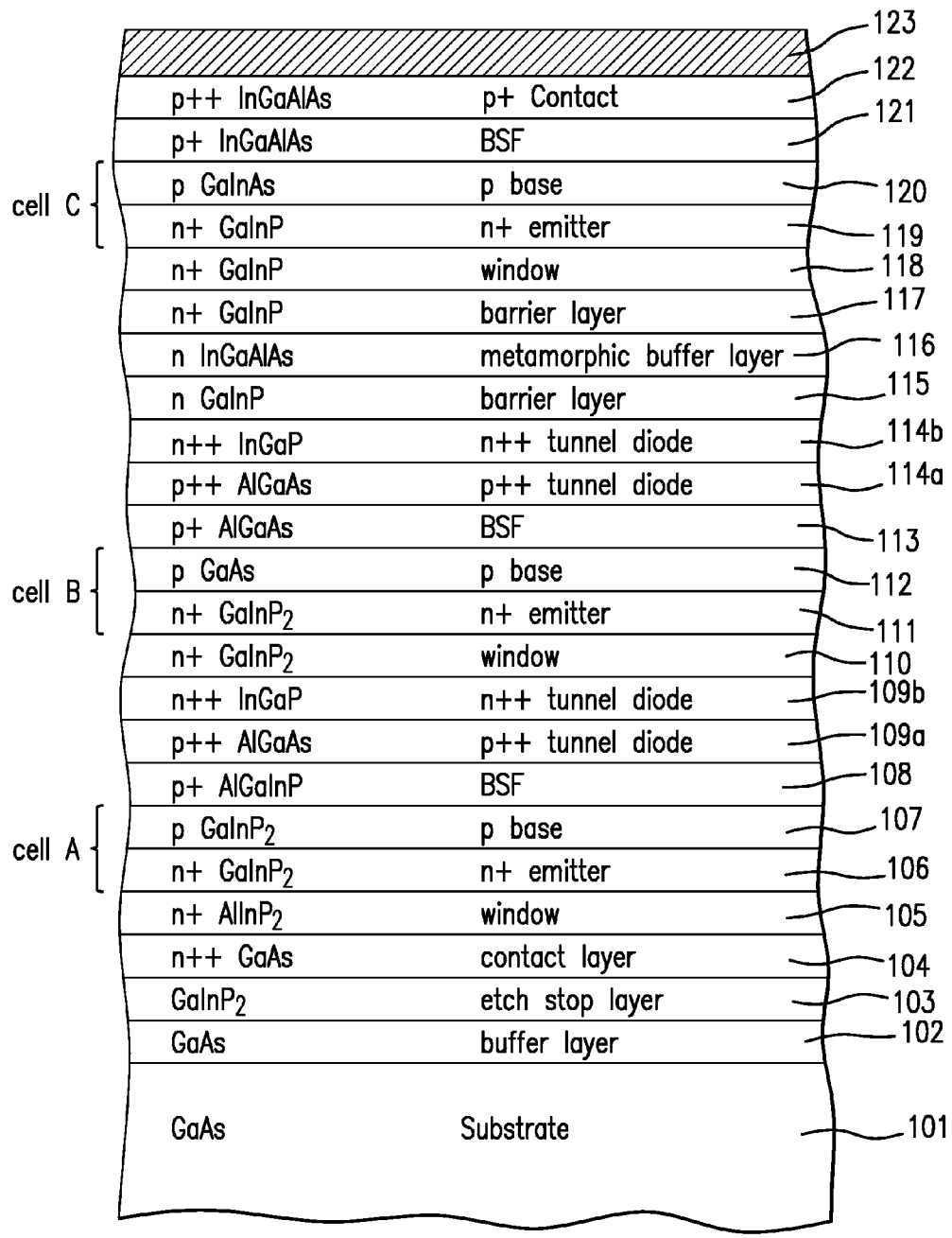
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. During subsequent processing steps, the semiconductor body and its associated metal layers and bonded structures will go through various heating and cooling processes, which may put stress on the surface of the semiconductor body. Accordingly, it is desirable to closely match the coefficient of thermal expansion of the associated layers or structures to that of the semiconductor body, while still maintaining appropriate electrical conductivity and structural properties of the layers or structures. Thus, in some embodiments, the metal contact layer 123 is selected to have a coefficient of thermal expansion (CTE) substantially similar to that of the adjacent semiconductor material. In relative terms, the CTE may be within a range of 0 to 10 ppm per degree Kelvin different from that of the adjacent semiconductor material. In the case of the specific semiconductor materials described above, in absolute terms, a suitable coefficient of thermal expansion of layer 123 would be equal to around 5 to 7 ppm per degree Kelvin. A variety of metallic compositions and multilayer structures including the element molybdenum would satisfy such criteria. In some embodiments, the layer 123 would preferably include the sequence of metal layers Ti/Au/Mo/Ag/Au, Ti/Ag/Ti/Mo/Au, or Ti/Mo/Ag, although other suitable sequences and material compositions may be used as well.

More generally, in other embodiments, the metal electrode layer may be selected to have a coefficient of thermal expansion that has a value less than 15 ppm per degree Kelvin.

In some embodiments, the metal electrode layer may have a coefficient of thermal expansion that has a value within 50% of the coefficient of thermal expansion of the adjacent semiconductor material.

In some embodiments, the metal electrode layer may have a coefficient of thermal expansion that has a value within 10% of the coefficient of thermal expansion of the adjacent semiconductor material.

In some embodiments, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

Figure 4:
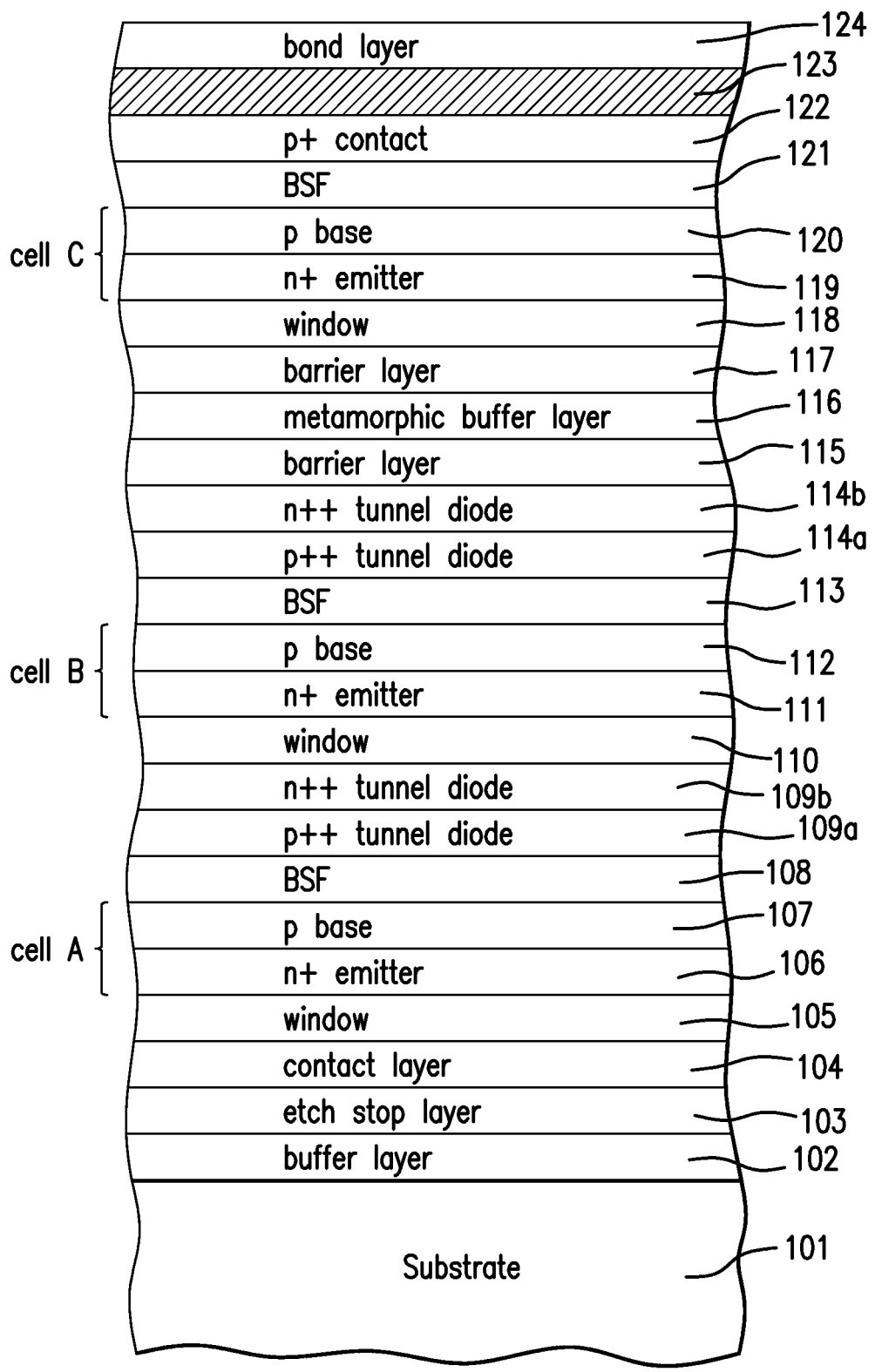
FIG. 4 is a cross-sectional view of the solar cell of FIG. 3 after the next process step.

FIG. 4 is a cross-sectional view of the solar cell of FIG. 3 after the next process step in some embodiments in which a bonding layer 124 is deposited over the metal layer 123. In one embodiment of the present invention, the bonding layer is an adhesive, preferably Wafer Bond (manufactured by Brewer Science, Inc. of Rolla, Mo.). In other embodiments of the present invention, a solder or eutectic bonding layer 124, such as described in U.S. patent application Ser. No. 12/271,127 filed Nov. 14, 2008, or a bonding layer 124 such as described in U.S. patent application Ser. No. 12/265,113 filed Nov. 5, 2008, may be used, where the surrogate substrate remains a permanent supporting component of the finished solar cell. Reference is also made to U.S. patent application Ser. No. 13/547,334 filed Jul. 12, 2012, herein incorporated by reference, to describe in one embodiment the preparation and bonding of a glass surrogate substrate 125 to the metal layer 123.

Figure 5A:
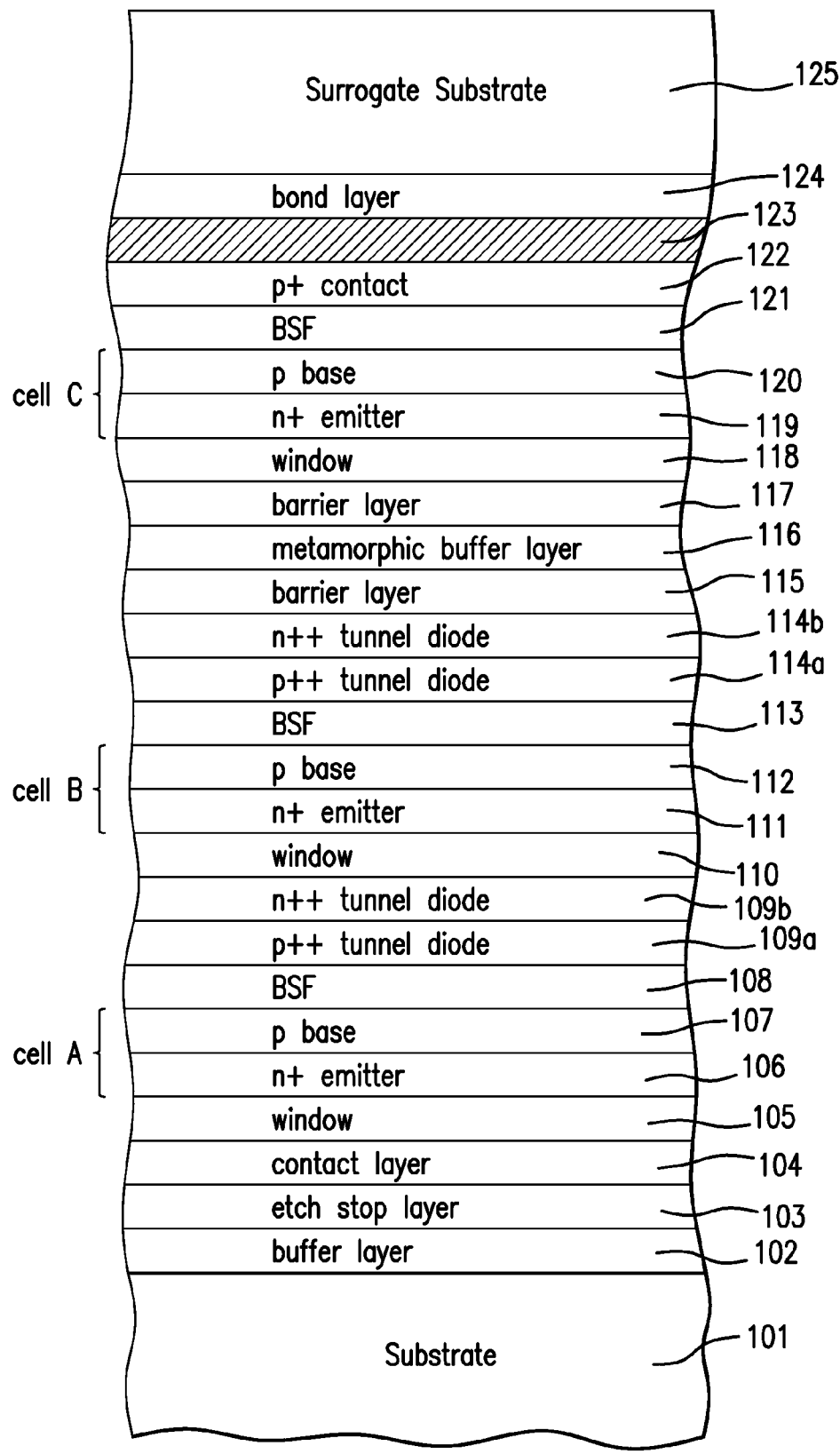
FIG. 5A is a cross-sectional view of the solar cell of FIG. 4 after the next process step in which a surrogate substrate is attached.

FIG. 5A is a cross-sectional view of the solar cell of FIG. 4 after the next process step in which a surrogate substrate 125 is attached. In some embodiments, the surrogate substrate 125 is glass, as described in U.S. patent application Ser. No. 13/547,334 filed Jul. 12, 2012 noted above. Alternatively, the surrogate substrate may be GaAs, Ge or Si, or other suitable material.

Figure 5B:
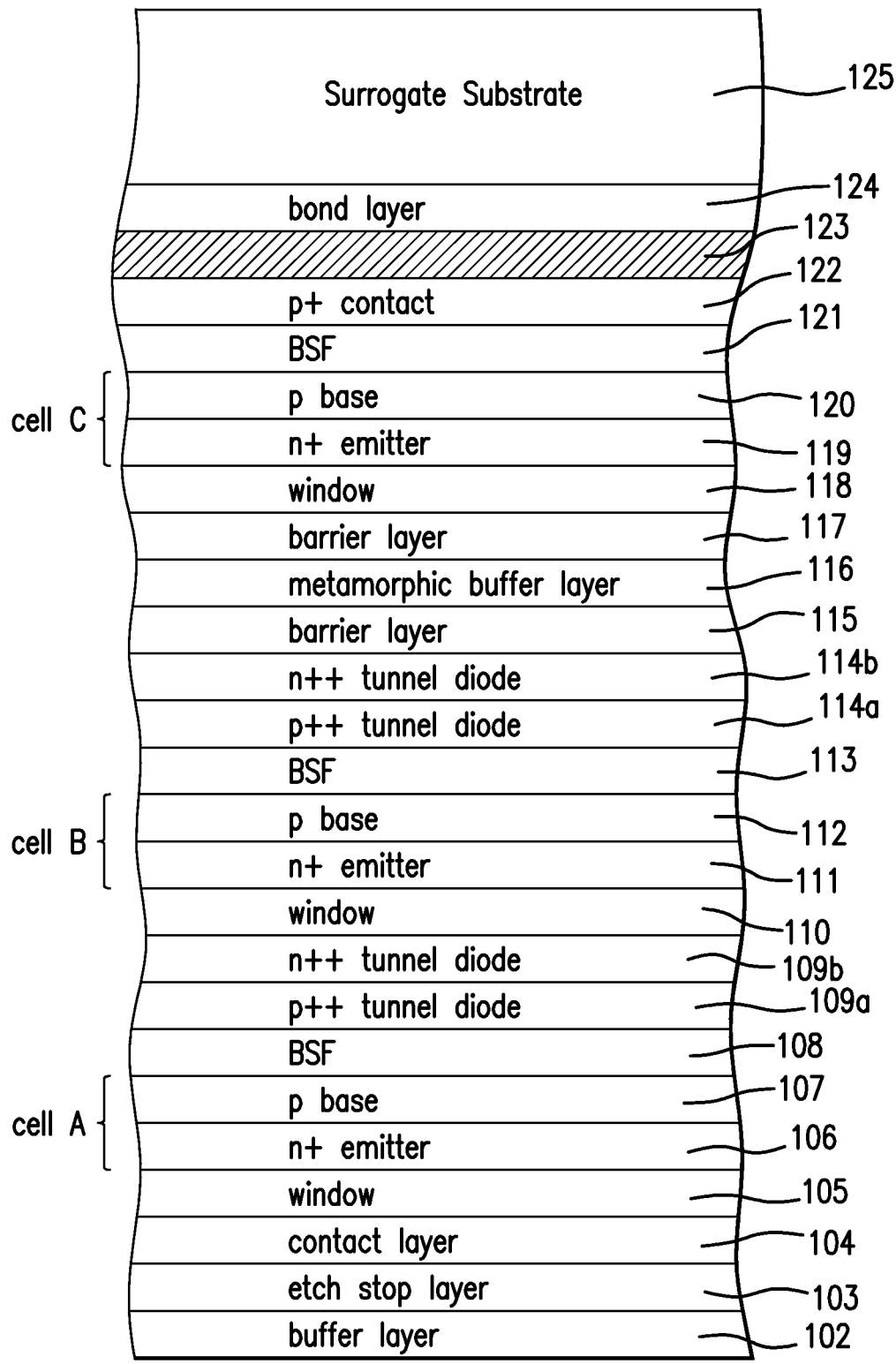
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed. In some embodiments, the substrate 101 may be removed by a sequence of lapping, grinding and/or etching steps in which the substrate 101, and the buffer layer 103 are removed. The choice of a particular etchant is growth substrate dependent. In other embodiments, the substrate may be removed by a lift-off process such as described in U.S. patent application Ser. No. 12/367,991, filed Feb. 9, 2009, hereby incorporated by reference.

Figure 5C:
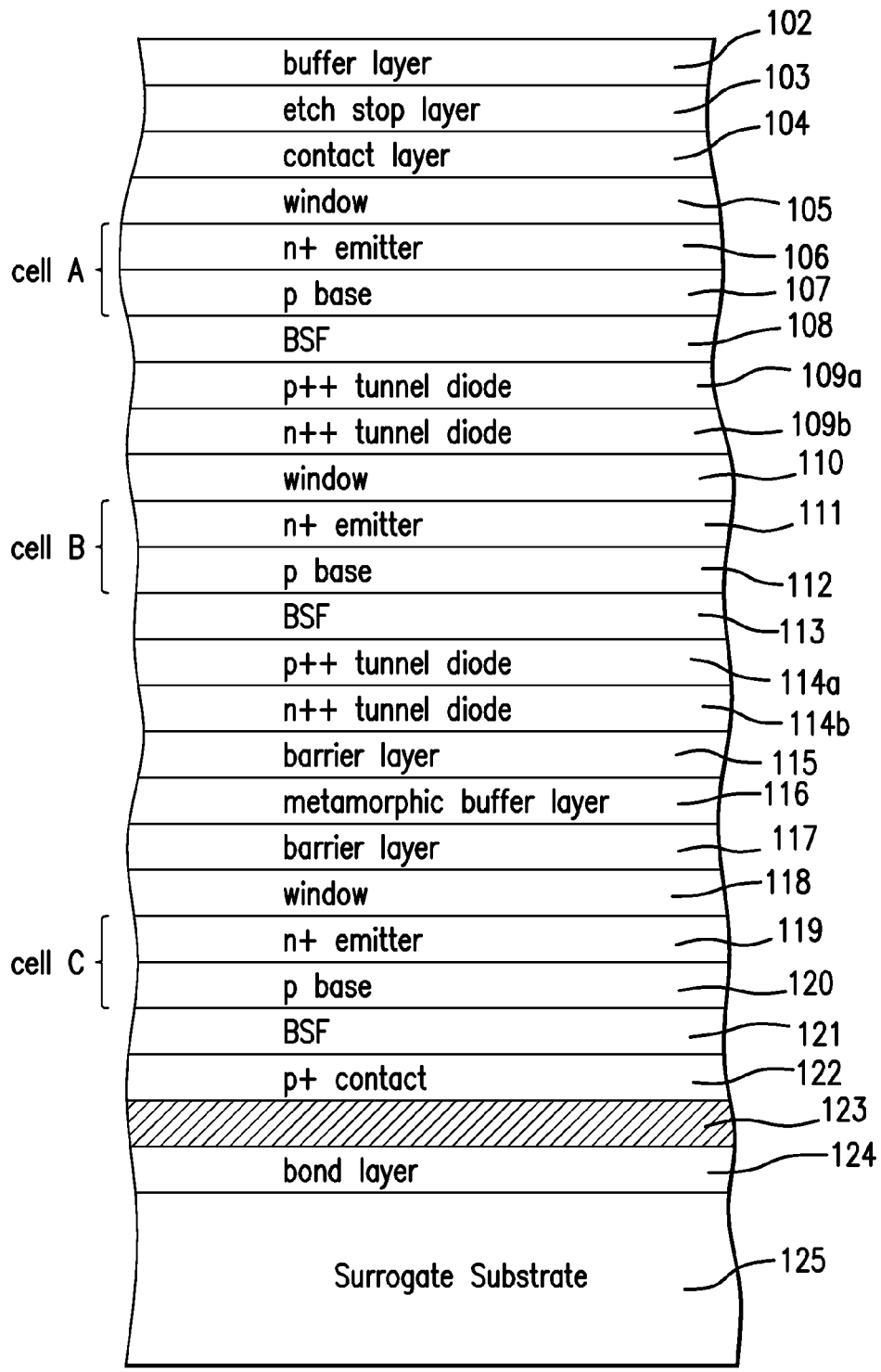
FIG. 5C is another cross-sectional view of the solar cell of FIG. 5B with the surrogate substrate on the bottom of the Figure.

FIG. 5C is a cross-sectional view of the solar cell of FIG. 5B with the orientation with the surrogate substrate 125 being at the bottom of the Figure. Subsequent Figures in this application will assume such orientation.

Figure 6:
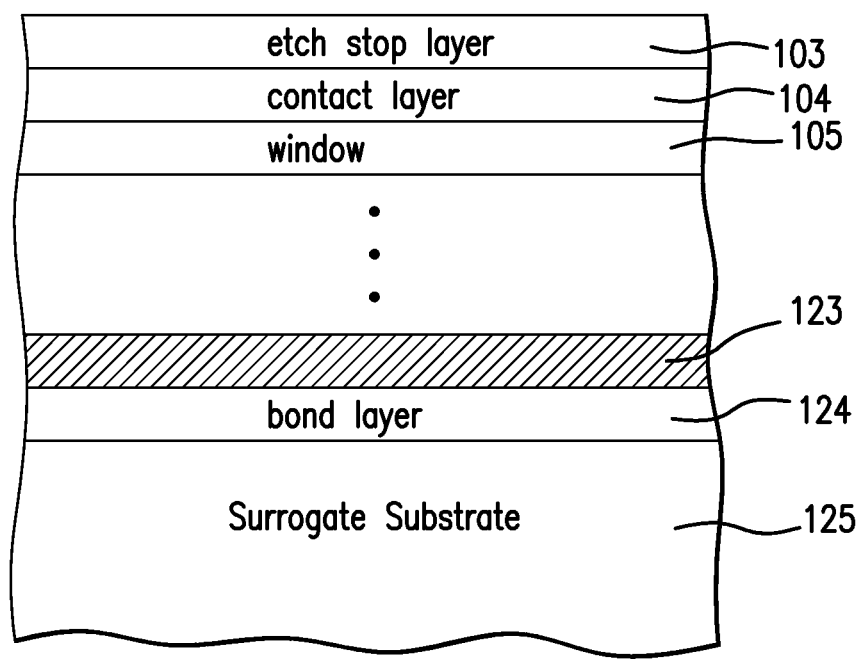
FIG. 6 is a simplified cross-sectional view of the solar cell of FIG. 5C after the next process step.

FIG. 6 is a simplified cross-sectional view of the solar cell of FIG. 5B depicting just a few of the top layers and lower layers over the surrogate substrate 125.

Figure 7:
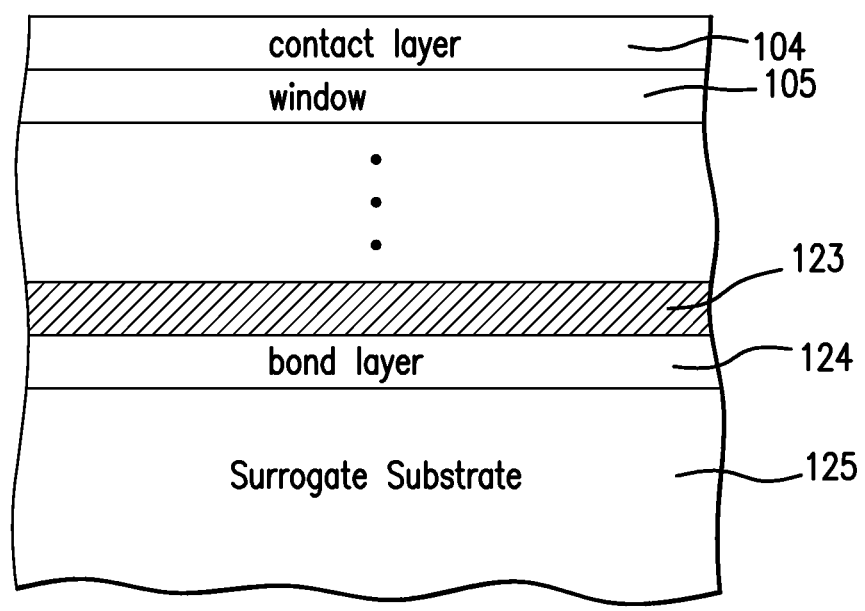
FIG. 7 is a cross-sectional view of the solar cell of FIG. 6 after the next process step.

FIG. 7 is a cross-sectional view of the solar cell of FIG. 6 after the next process step in which the etch stop layer 103 is removed by a HCl/$H_2O$ solution.

Figure 8:
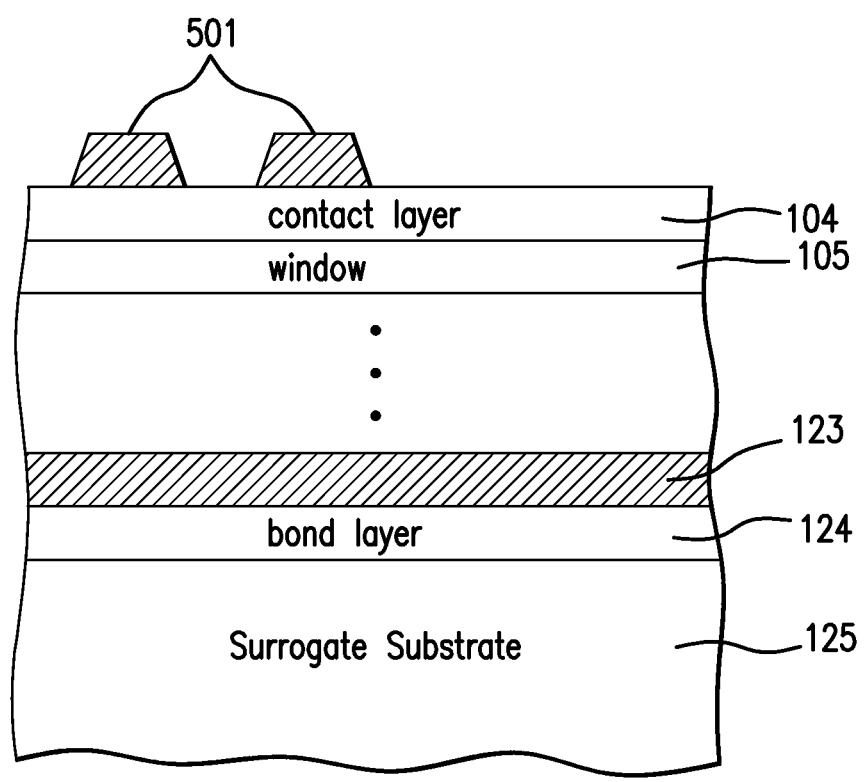
FIG. 8 is a cross-sectional view of the solar cell of FIG. 7 after the next process step.

FIG. 8 is a cross-sectional view of the solar cell of FIG. 7 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures. FIG. 8 is a cross-sectional view of the solar cell of FIG. 7 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

Prior to the metal deposition, of the n-contact, residual oxide is removed by soaking the wafer in a solution of 15 ($H_2O$):1 ($NH_4OH$) for one minute and spin dried in $N_2$. The wafer is loaded in the deposition chamber within 30 minutes to preclude excessive oxide growth. The metallization in the preferred embodiment, the sequence of layers of 50 nm Pd/100 nm Ge/30 nm Ti/30 nm Pd/5 μm Ag/100 nm Au is e-beam evaporated during one vacuum cycle. The background chamber pressure at the beginning of deposition is $5 \times 10^{-7}$ torr. Following deposition, the grid lines 501 and bus bar are defined by liftoff.

The two embodiments of the contact composition according to the present invention, viz. Au/Ge/Pd/Au or Pd/Ge/Ti/Pd/Au, are illustrated in FIG. 8.

As more fully described in U.S. patent application Ser. No. 12/218,582 filed Jul. 18, 2008, hereby incorporated by reference, the grid lines 501 may be composed of the sequence of layers Pd/Ge/Ti/Pd/Au, Pd/Ge/Ti/Pd/Ag/Au, or other suitable sequences and materials.

Figure 9:
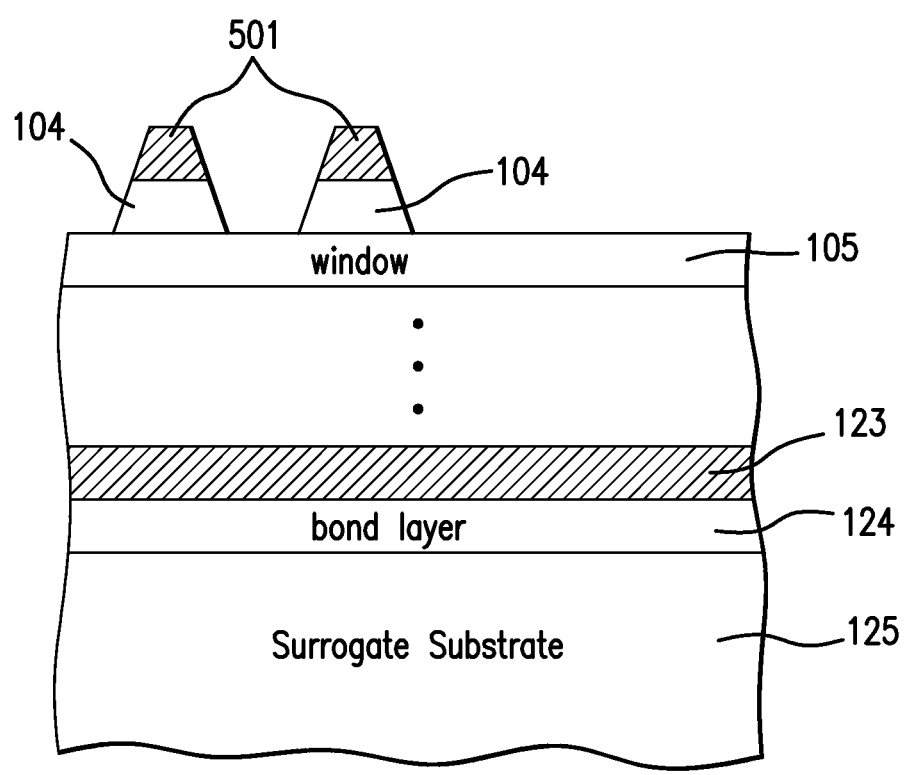
FIG. 9 is a cross-sectional view of the solar cell of FIG. 8 after the next process step.

FIG. 9 is a cross-sectional view of the solar cell of FIG. 8 after the next process step in which the grid lines are used as a mask to etch down the surface to the window layer 105 using a citric acid/peroxide etching mixture.

Figure 10A:
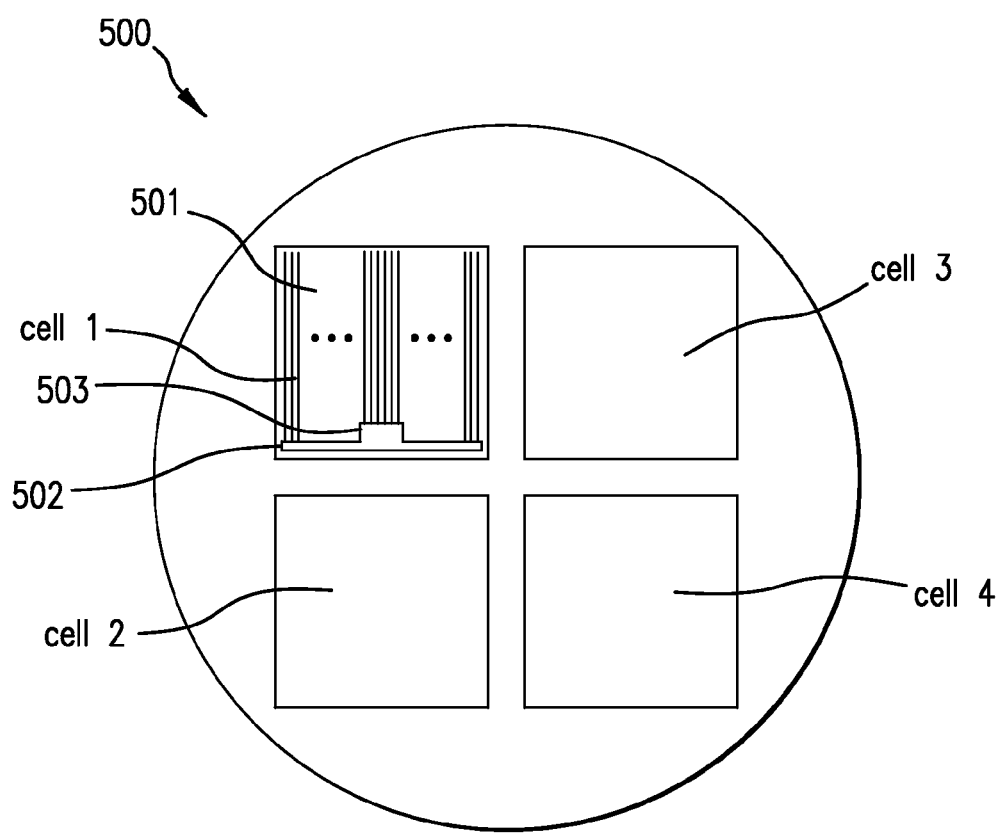
FIG. 10A is a top plan view of a wafer in which four solar cells are fabricated.

FIG. 10A is a top plan view of a 100 mm (or 4 inch) wafer in which four solar cells are implemented. The depiction of four cells is for illustration for purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines and the contact pad are illustrative and the present invention is not limited to the illustrated embodiment.

Figure 10B:
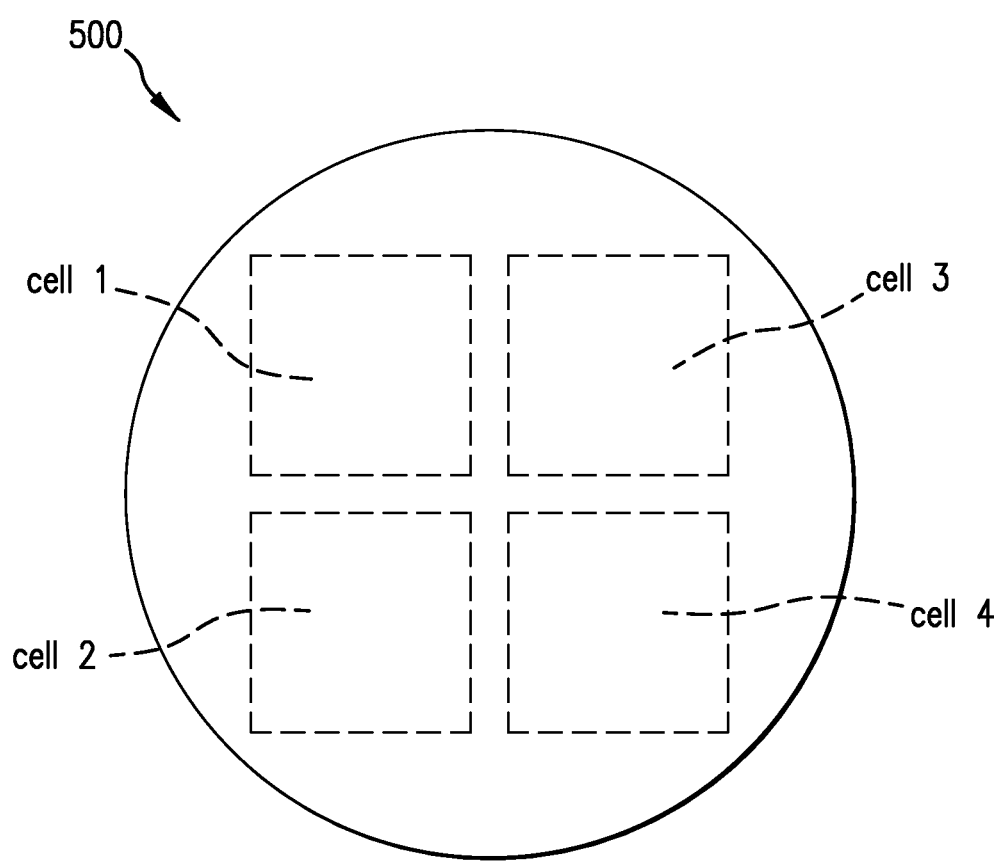
FIG. 10B is a bottom plan view of the wafer in which the four solar cells are fabricated.
Figure 10C:
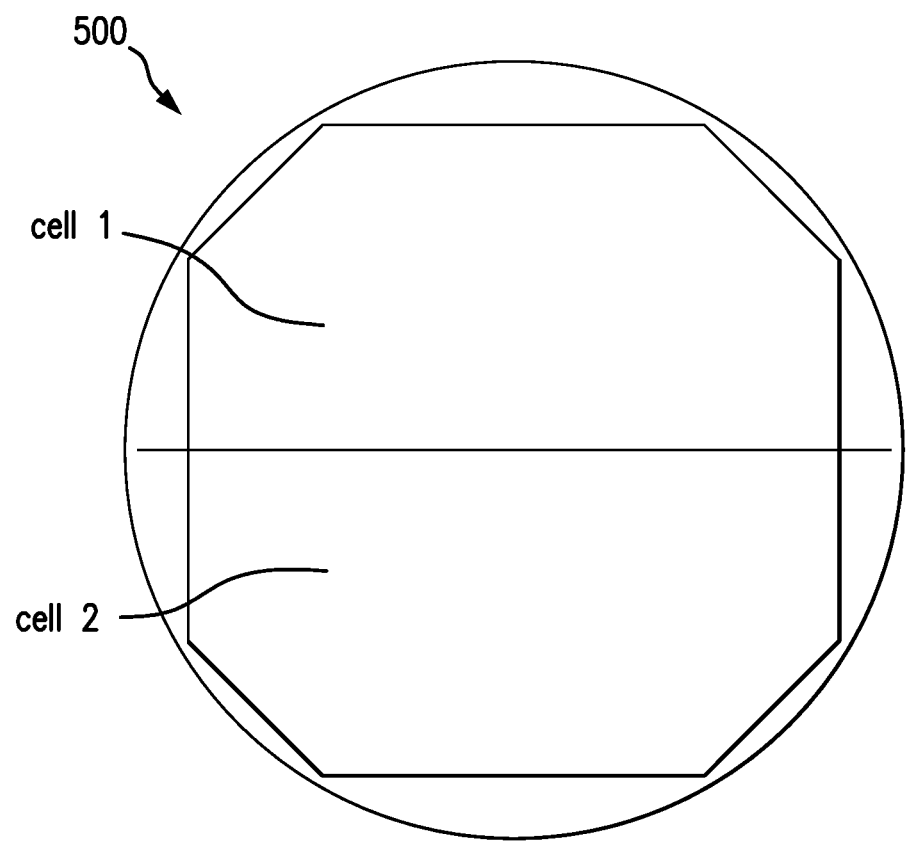
FIG. 10C is a top plan view of a wafer in which two solar cells are fabricated.

FIG. 10B is a bottom plan view of the wafer of FIG. 10A in which the four solar cells are fabricated, with the location of the cells shown in dotted lines;

FIG. 10C is a top plan view of a 100 mm (or 4 inch) wafer in which two solar cells are implemented. In this depicted example, each solar cell has an area of 26.3 cm$^2$ and a power/weight ratio (after separation from the growth and surrogate substrates) of 945 mW/g, for a 4 cm$^2$ cell with a 4 mil cover slide permanently attached.

Figure 11A:
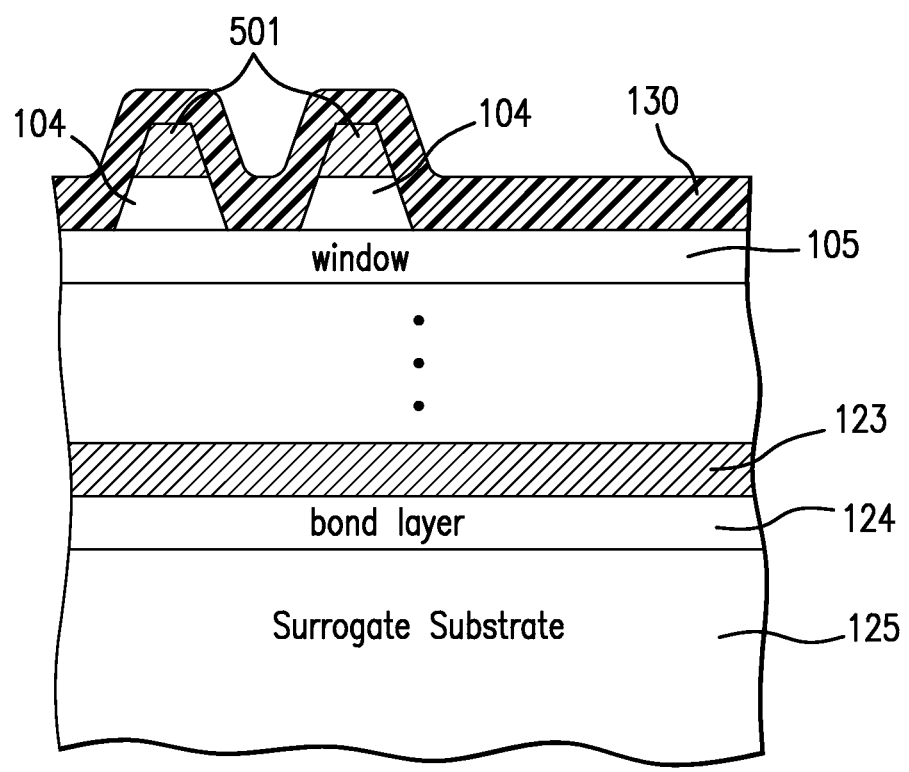
FIG. 11A is a cross-sectional view of the solar cell of FIG. 9 after the next process step.

FIG. 11A is a cross-sectional view of the solar cell of FIG. 9 after the next process step in which an antireflective (ARC) dielectric coating layer 130 is applied over the entire surface of the "top" side of the wafer with the grid lines 501.

Figure 11B:
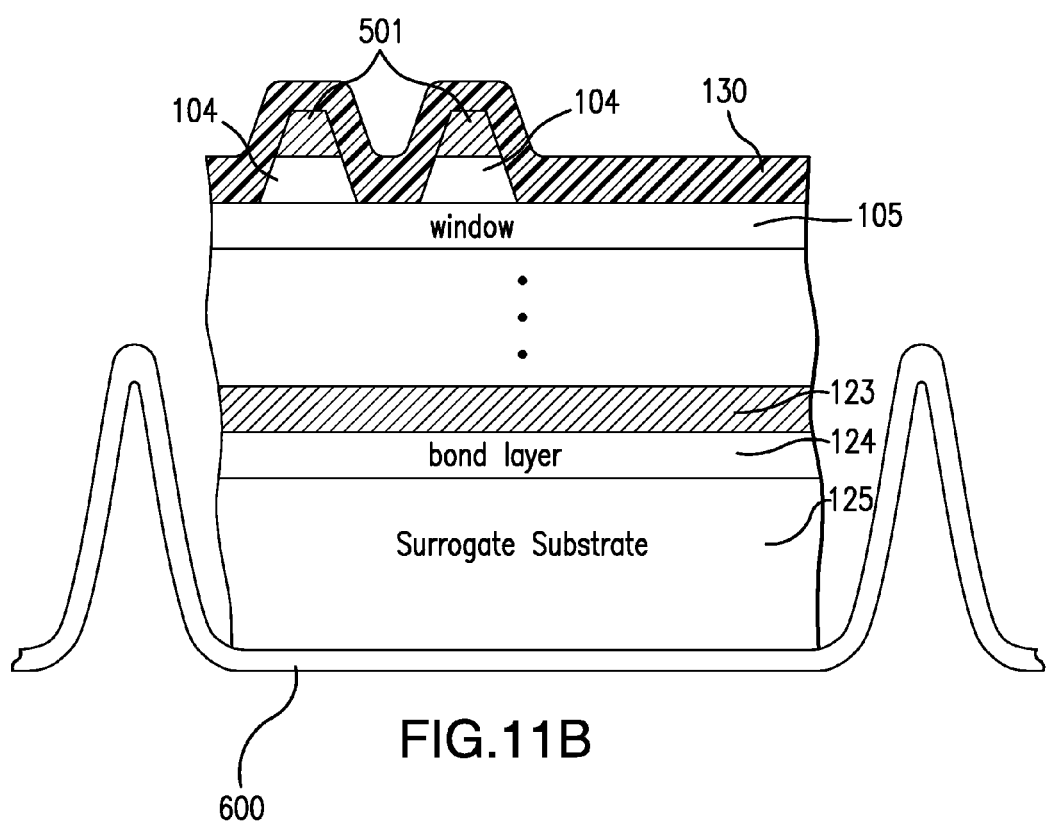
FIG. 11B is a cross-sectional view of the solar cell of FIG. 11A after the next process step.

FIG. 11B is a cross-sectional view of the solar cell of FIG. 11A after the next process step in which the wafer is supported on or in a contaminant isolation envelope 600 so that during the subsequent annealing process, as the temperature rises and the bond layer 124 tends to liquefy, the substrate 125 and the epitaxial structure 123 to 130 do not become detached, and moreover any contaminants present in the oven are isolated from a substantial portion of the wafer or processing assembly so that they are less likely to mix with or contaminate the materials in the solar cell.

The contaminant isolation envelope 600 may be a flexible fabric (cotton or other suitable material) that is positioned to support and/or cover those portions of the wafer or processing assembly that may be affected by contamination.

The next step is annealing. During the annealing process, sintering is performed in an oven at lab ambient or pure nitrogen atmosphere, and in some embodiments may utilize either an oven or hot plate. The wafer with its contaminant isolation envelope is placed grid side up on a tray in an oven which has been set for a temperature of at least 205 degrees C. for a period of sixty minutes. After the contacts have been suitably sintered, the wafer and tray are removed from the oven and allowed to cool down to ambient temperature. Transmission line method (TLM) patterns formed on the solar cell wafer then permit specific contact resistance measurements, as will be subsequently described in connection with FIG. 20.

Figure 12A:
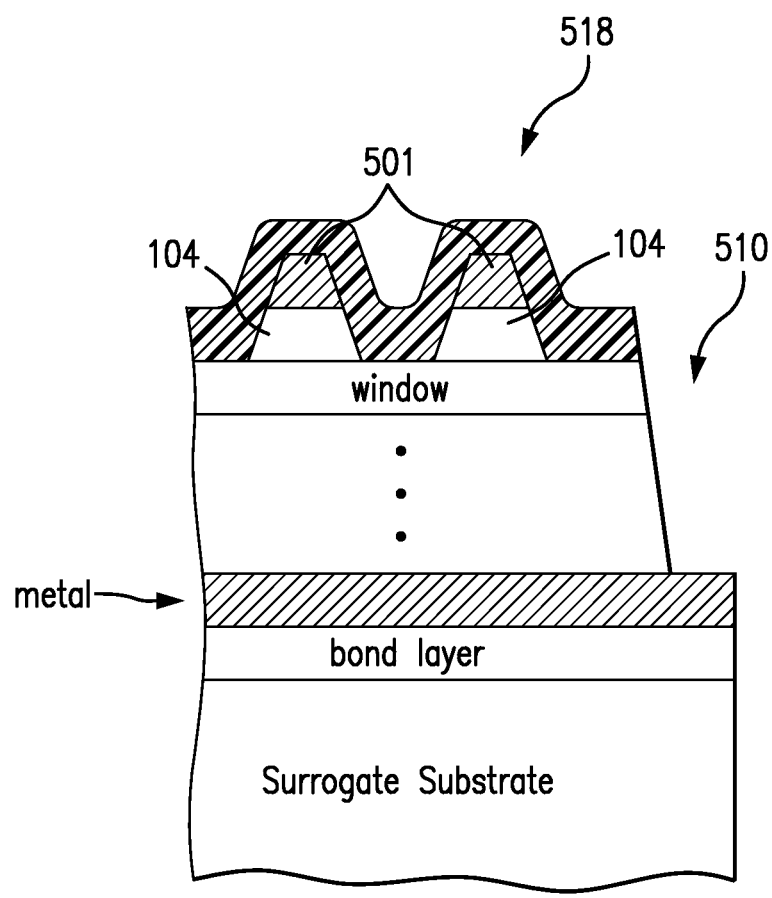
FIG. 12A is a cross-sectional view of the solar cell of FIG. 11B after the next process step, in a view orthogonal to the grid lines.

FIG. 12A is a cross-sectional view of the solar cell of FIG. 11B after the next process step according to some embodiments of the present invention in an annular channel 510, or portion of the semiconductor structure are etched down to the metal layer 123 using phosphide and arsenide etchants. This channel 510 defines a peripheral boundary between the cell and the rest of the wafer, and leaves a mesa structure which constitutes the solar cell. The cross-section depicted in FIG. 12A is that as seen from the A-A plane shown in FIG. 13.

Figure 12B:
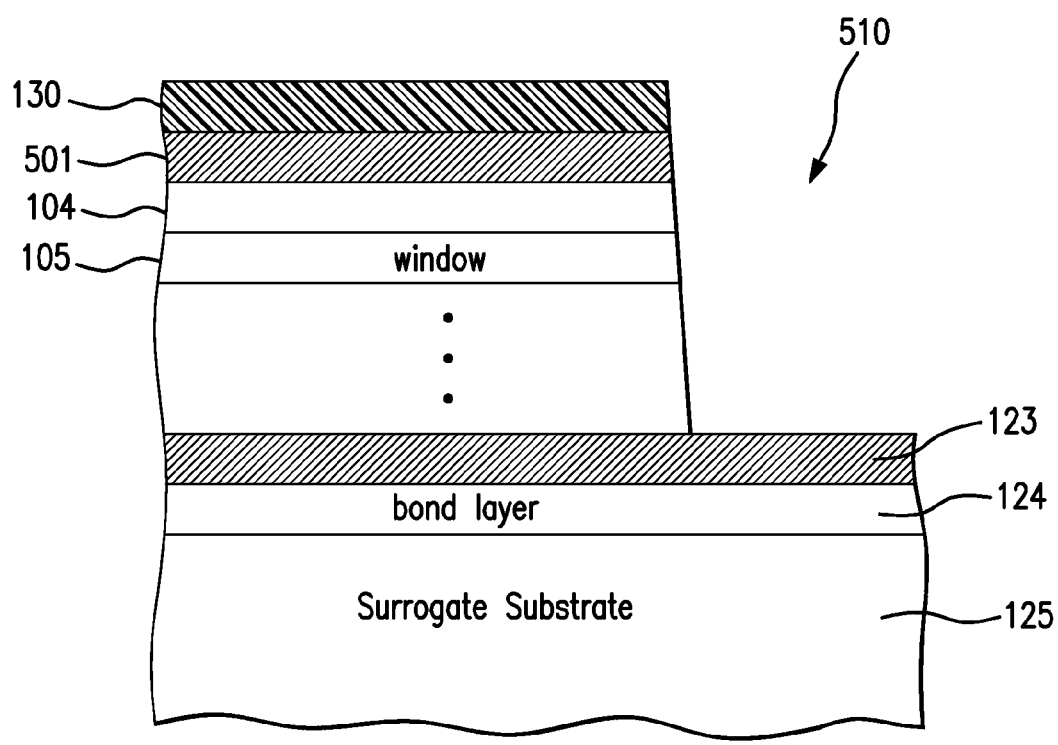
FIG. 12B is a cross-sectional view of the solar cell of FIG. 11B after the next process step, in a view along a grid line.

FIG. 12B is a cross-sectional view of the solar cell of FIG. 11 similar to that of FIG. 12A, but in a view longitudinally along a grid line.

Figure 13A:
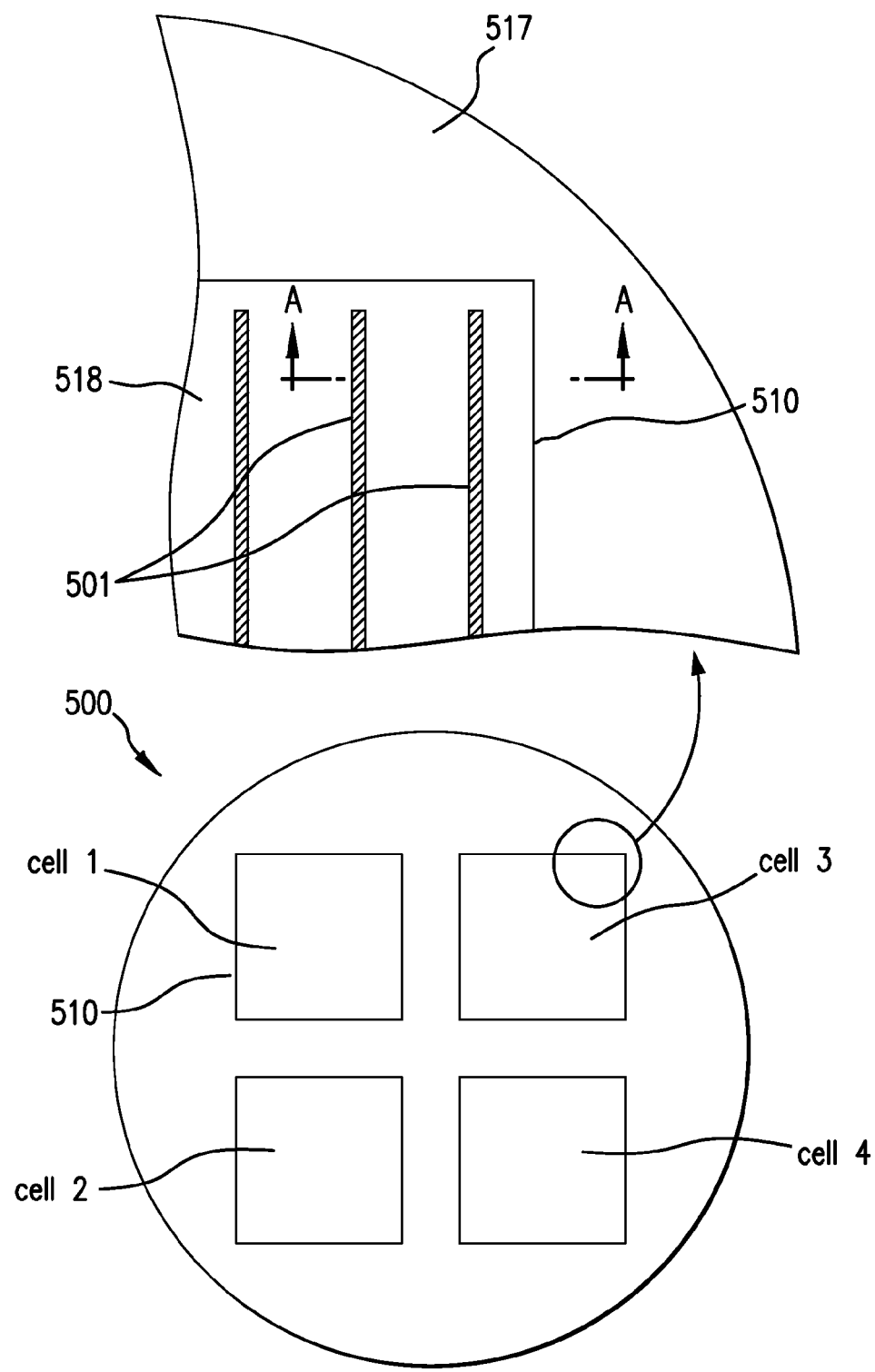
FIG. 13A is a top plan view of the wafer of FIG. 10A depicting the surface view of the trench etched around the cell, after the next process step.

FIG. 13A is a top plan view of the wafer of FIG. 10A, depicting the channel 510 etched around the periphery of each cell which were shown in cross-section in FIGS. 12A and 12B.

Figure 13B:
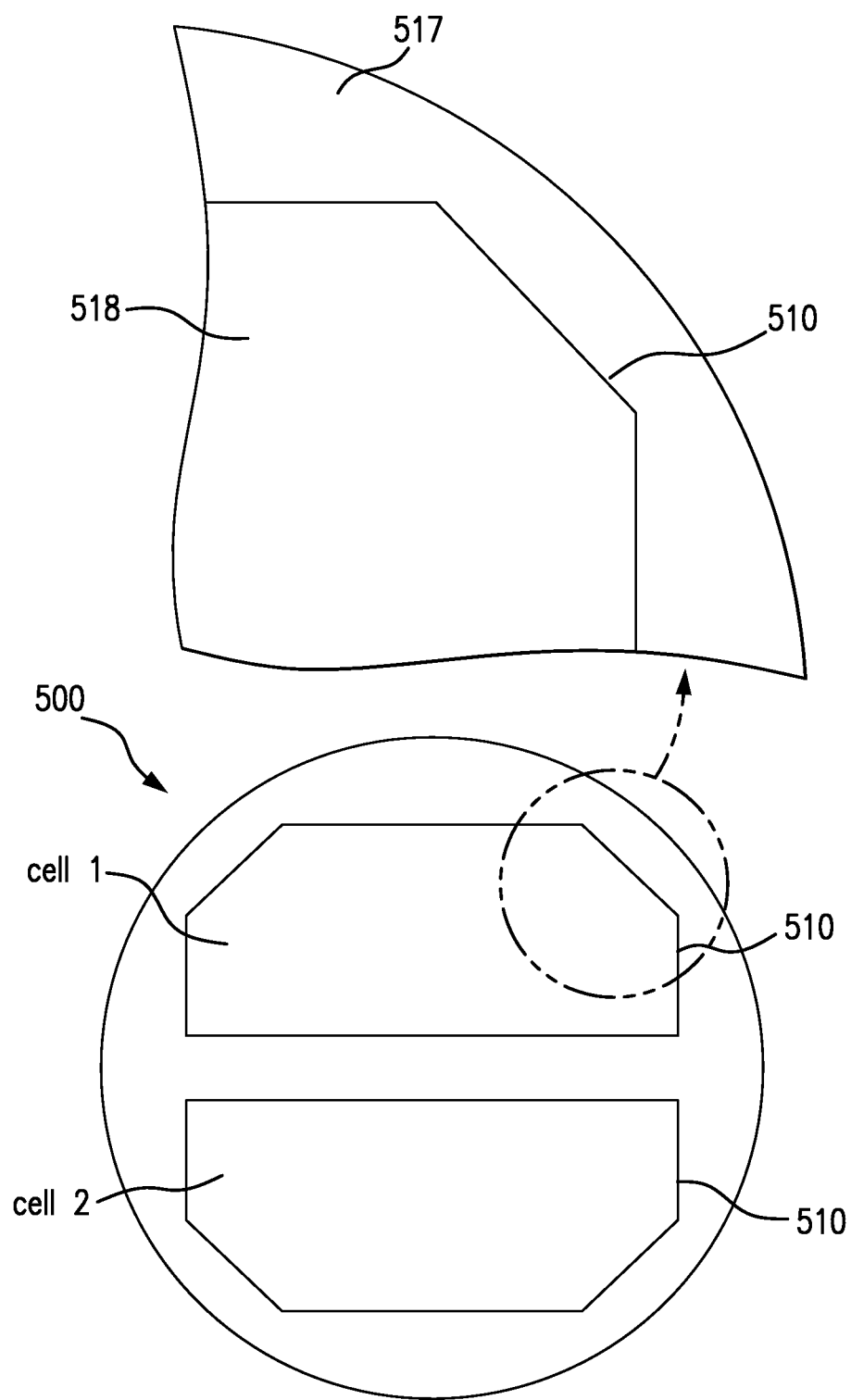
FIG. 13B is a top plan view of the wafer of FIG. 10C depicting the surface view of the trench etched around the cell, after the next process step.

FIG. 13B is a top plan view of the wafer of FIG. 10C depicting the channel 510 etched around the periphery of each cell which were shown in cross-section in FIGS. 12A and 12B.

Figure 13C:
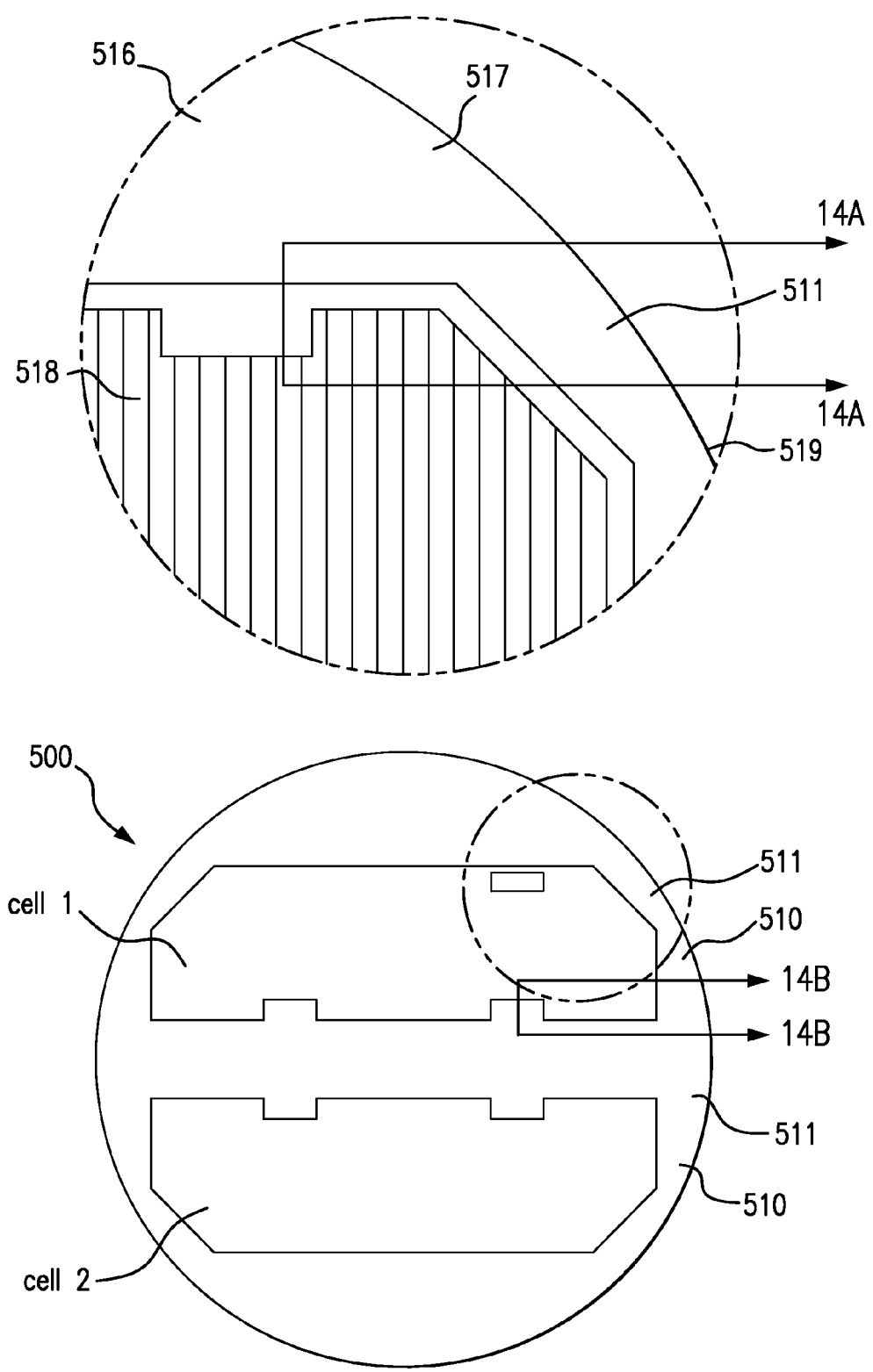
FIG. 13C is a top plan view of the wafer of FIG. 13B, after the next process steps.

FIG. 13C is a top plan view of the wafer of FIG. 13B, after the next process steps in which a portions of the ARC layer 130 are removed to provide access to the grid metal layer 501 for contact pads.

Figure 14A:
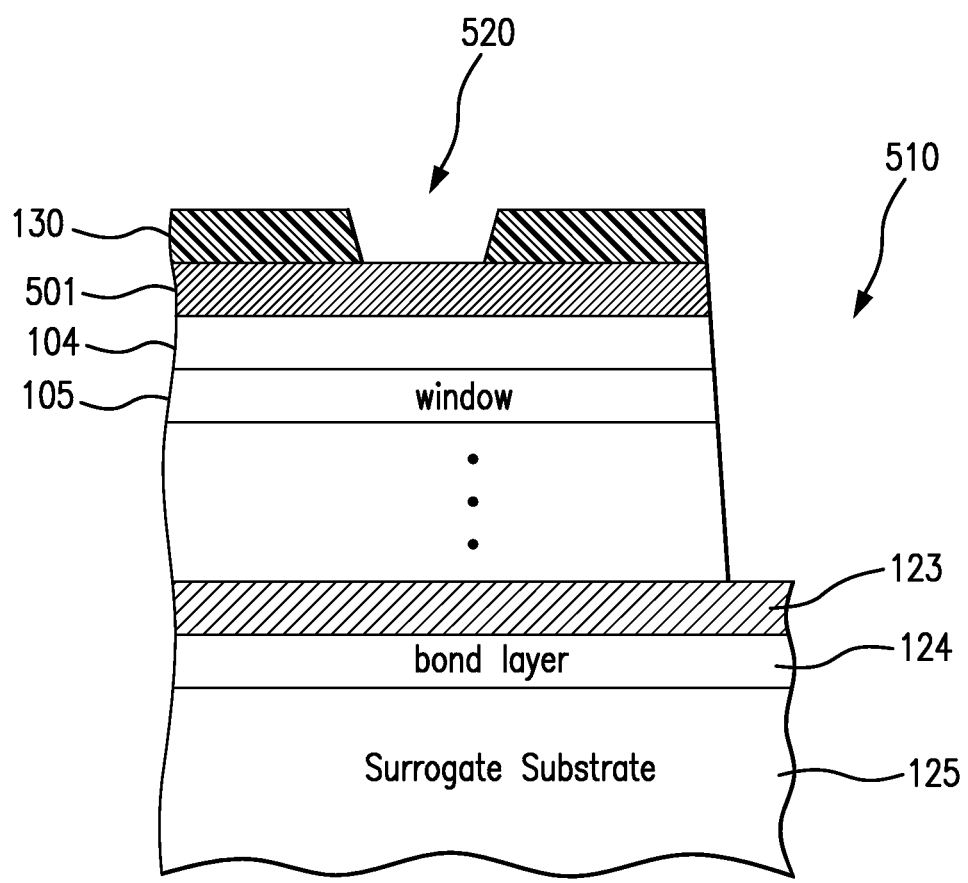
FIG. 14A is a cross-sectional view of the solar cell of FIG. 13C though the 14A-14A plane.

FIG. 14A is a cross-sectional view of the solar cell of FIG. 13C though the 14A-14A plane. A contact pad 520 to the grid metal layer 501 is depicted.

Figure 14B:
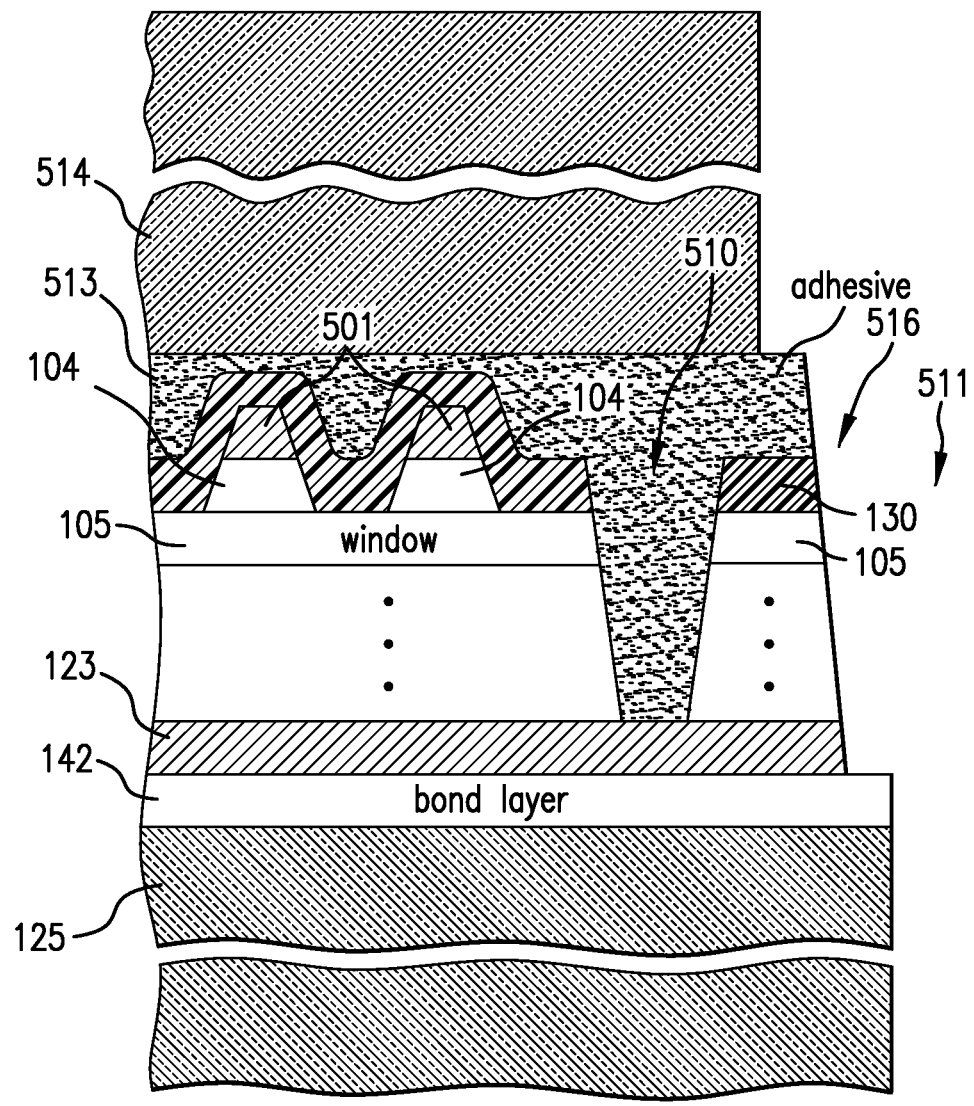
FIG. 14B is a cross-sectional view of the solar cell of FIG. 14A after the next process step in an embodiment of the present invention in which a cover glass in employed.

FIG. 14B is a cross-sectional view of the solar cell of FIG. 14B after the next process step in another embodiment of the present invention in which a cover glass 514 is secured to the top of the cell by an adhesive 513. The cover glass 514 is typically about 4 mils thick. Although the use of a cover glass is desirable for many environmental conditions and applications, it is not necessary for all implementations, and additional layers or structures may also be utilized for providing additional support or environmental protection to the solar cell.

Figure 15:
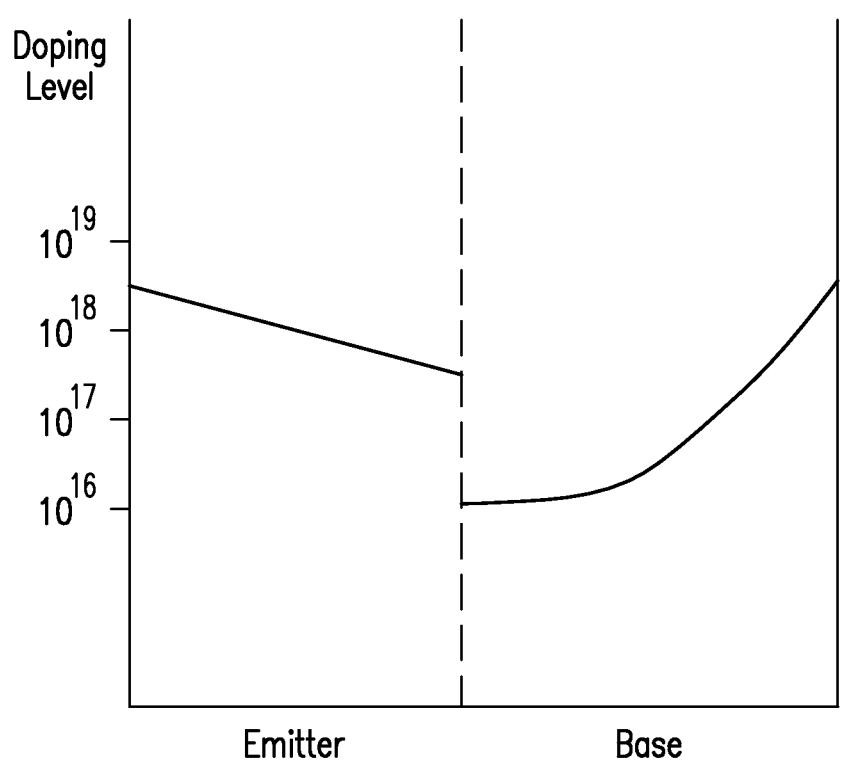
FIG. 15 is a graph of the doping profile in the base and emitter layers of a subcell in the metamorphic solar cell according to the present invention.

FIG. 15 is a graph of a doping profile in the emitter and base layers in one or more subcells of some embodiments of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 16:
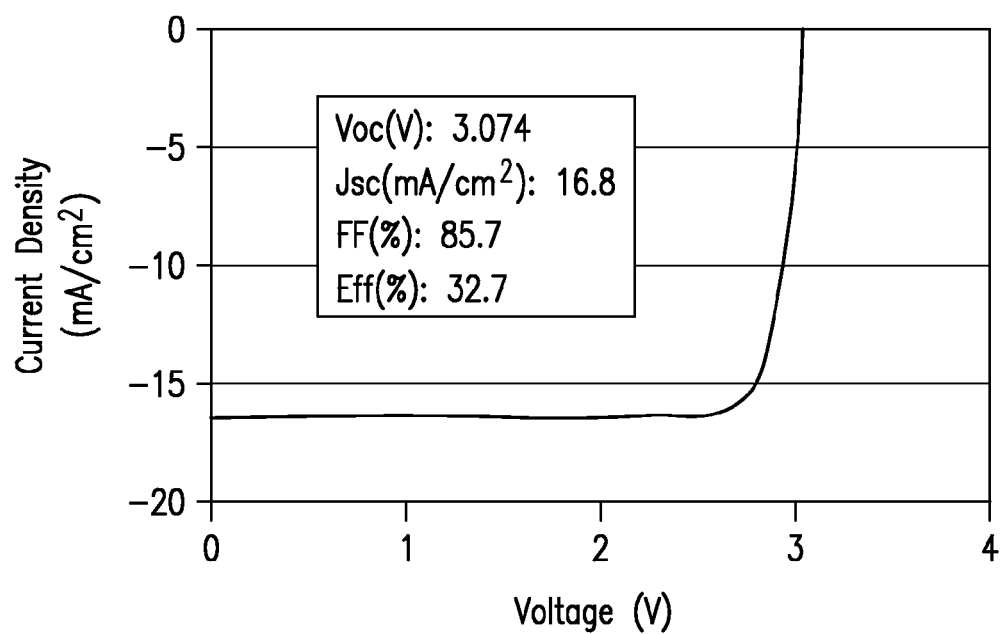
FIG. 16 is a graph that depicts the current and voltage characteristics of an inverted metamorphic multijunction solar cell according to the present invention.

FIG. 16 is a graph that depicts the current and voltage characteristics of the solar cell that is representative of inverted metamorphic multijunction solar cells disclosed in the related applications noted above and according to the present disclosure. The solar cell has an open circuit voltage ($V_{oc}$) of approximately 3.074 volts, a short circuit current of approximately 16.8 mA/cm$^2$, a fill factor of approximately 85.7%, and an efficiency of 32.7%.

Figure 17:
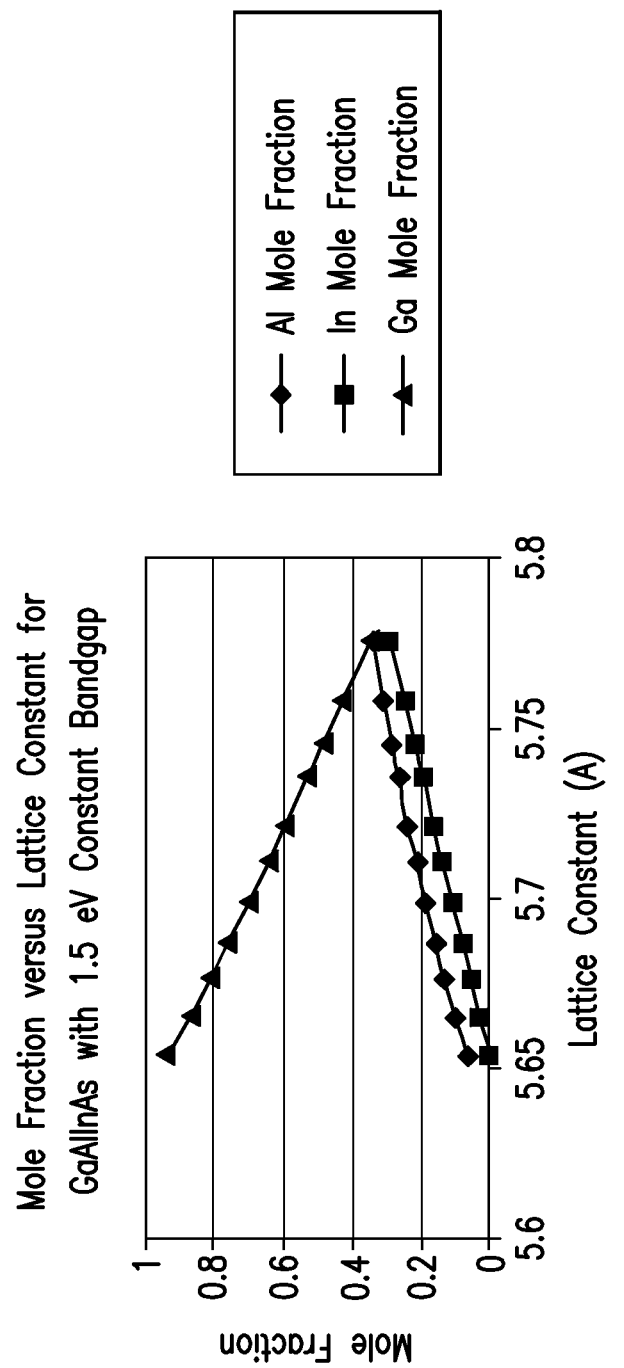
FIG. 17 is a graph representing the Al, Ga and In mole fractions versus the lattice constant in a AlGaInAs material system that is necessary to achieve a constant 1.5 eV band gap.

FIG. 17 is a graph representing the Al, Ga and In mole fractions versus lattice constant in a AlGaInAs material system that is necessary to achieve a constant 1.5 eV band gap.

FIG. 18 is a diagram representing the relative concentration of Al, In, and Ga in an AlGaInAs material system needed to have a constant band gap with various designated values (ranging from 0.4 eV to 2.1 eV) as represented by curves on the diagram. The range of band gaps of various GaInAlAs materials is represented as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 19:
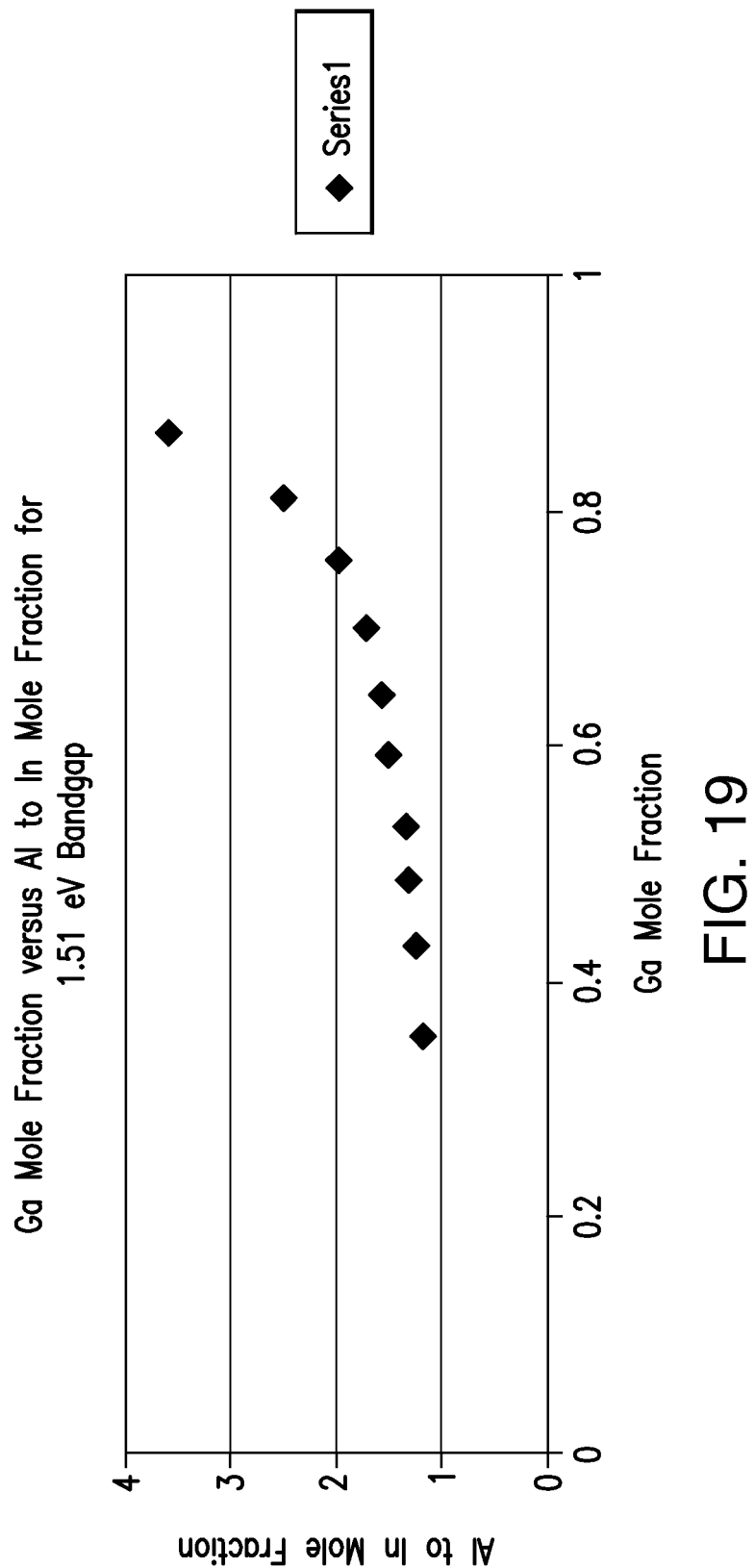
FIG. 19 is a graph representing the Ga mole fraction to the Al to In mole fraction in a AlGaInAs material system that is necessary to achieve a constant 1.51 eV band gap.

FIG. 19 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.51 eV band gap.

Figure 20:
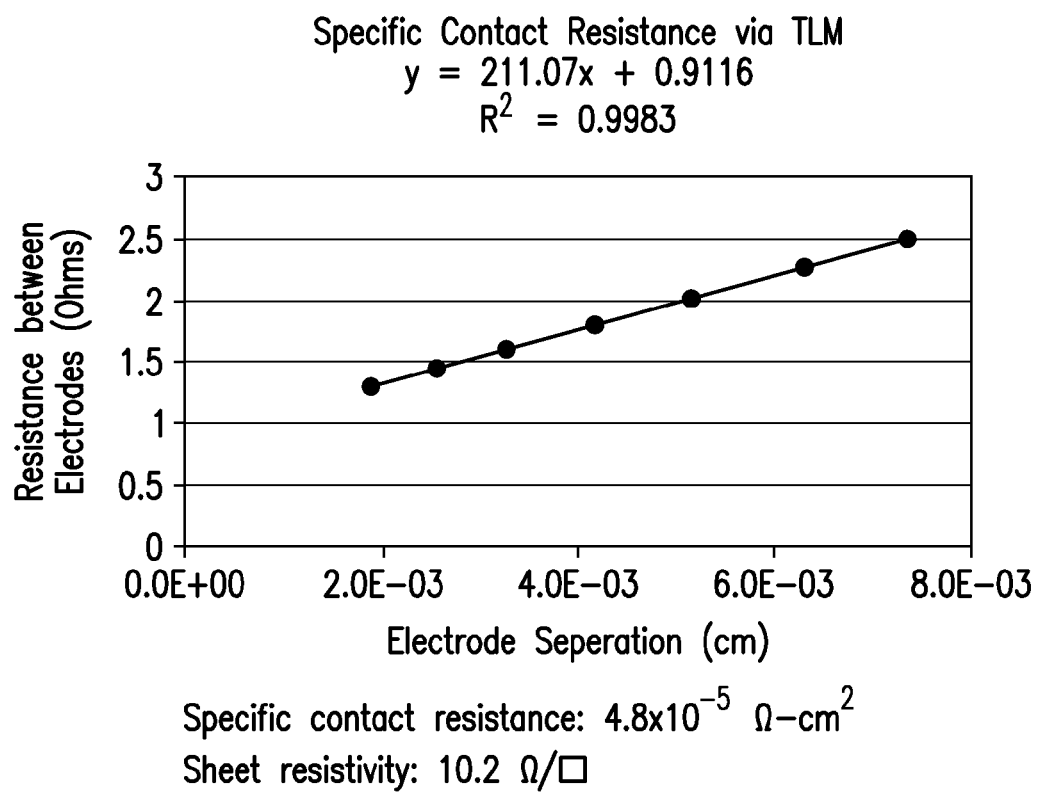
FIG. 20 is a graph depicting the results of a TLM pattern measurement.

FIG. 20 is a graph depicting the results of a TLM pattern measurement on wafers with contacts 501 formed with Pd/Ge/Ti/Pd/Au according to the present invention, with the resistance between electrodes (measured in ohms) shown as a function of the electrode separation, depicted along the x-axis.

It will be understood that each of the elements described above, or two or more together, also may find a useful application in other types of constructions differing from the types of constructions described above.

Although some of the embodiments of the present invention utilizes a vertical stack of three subcells, the present invention can apply to stacks with fewer or greater number of subcells, i.e. two junction cells, four junction cells, five junction cells, etc. as more particularly described in U.S. patent application Ser. No. 12/267,812 filed Nov. 10, 2008. In the case of four or more junction cells, the use of more than one metamorphic grading interlayer may also be utilized, as more particularly described in U.S. patent application Ser. No. 12/271,192 filed Nov. 14, 2008.

In addition, although in some embodiments the solar cell is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, embodiments of the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some embodiments, a thin so-called "intrinsic layer" may be placed between the emitter layer and base layer of some subcells, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness. Some such configurations are more particularly described in copending U.S. patent application Ser. No. 12/253,051 filed Oct. 16, 2008.

The composition of the window or BSF layers may utilize other semiconductor compounds, subject to lattice constant and band gap requirements, and in some embodiments may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:
1. A method of manufacturing a solar cell comprising:
providing a first semiconductor substrate;
operating an MOCVD reactor to deposit on the first substrate an epitaxial sequence of layers of semiconductor material forming a solar cell;
bonding a surrogate substrate on top of the sequence of layers with a bonding material to form a processing assembly;
removing the first substrate;
depositing a contact layer including germanium and palladium on a top surface of the solar cell, said contact layer having a resistance of less than $5 \times 10^{-4}$ ohms-cm$^2$;
lithographically patterning the contact layer to form a plurality of metal grid lines disposed on the top surface of the solar cell, said contact layer having at least one metal contact pad electrically connected to said grid lines and disposed adjacent to a first peripheral edge of said solar cell;
supporting the processing assembly on a contaminant isolation envelope so that during a subsequent annealing process at a temperature sufficient to liquefy the bonding material, the surrogate substrate and the sequence of layers forming the solar cell do not become detached; and annealing the processing assembly at a temperature of at least 205 degrees C. wherein the surrogate substrate and the sequence of layers forming the solar cell do not become detached.

2. The method as defined in claim 1, wherein the depositing an epitaxial sequence of layers comprises:

forming a first subcell on said first substrate with a first semiconductor material with a first band gap and a first lattice constant;

forming a second subcell comprising a second semiconductor material with a second band gap and a second lattice constant, wherein the second band gap is less than the first band gap and the second lattice constant is greater than the first lattice constant; and forming a lattice constant transition material positioned between the first subcell and the second subcell, said lattice constant transition material having a lattice constant that changes gradually from the first lattice constant to the second lattice constant.

3. The method as defined in claim 2, wherein said first subcell is composed of an GaInP, GaAs, GaInAs, GaAsSb, or GaInAsN emitter region and an GaAs, GaInAs, GaAsSb, or GaInAsN base region.

4. The method as defined in claim 2, wherein the second subcell is composed of an InGaAs base and emitter regions.

5. The method as defined in claim 2, wherein said lattice constant transition material is composed of any of the As, N, Sb based III-V compound semiconductors subject to constraints of having an in-plane lattice parameter greater or equal to that of the first subcell and less than or equal to that of the second subcell, and having a band gap energy greater than that of the first subcell.

6. The method as defined in claim 2, wherein the lattice constant transition material is composed of $(In_xGa_{1-x})_yAl_{1-y}As$, where $0<x<1$ and $0<y<1$, and with x and y selected such that the band gap of the lattice constant transition material remains constant at a band gap energy greater than that of said first subcell.

7. The method as defined in claim 2, wherein the band gap of the lattice constant transition material remains constant at approximately 1.50 eV.

8. The method as defined in claim 1, wherein the contact layer is sintered at 205° C.

9. The method as defined in claim 1, wherein the contact layer is sintered for approximately 35 minutes or less.

10. The method as defined in claim 1, wherein the contact layer is a Pd/Ge/Ti/Pd/Au sequence of layers.

11. The method as defined in claim 1, wherein the contact layer is sintered for approximately 35 minutes.

12. The method as defined in claim 1, wherein the contact resistance is approximately $1\times10^{-4}$ ohms-cm$^2$.

13. The method as defined in claim 1, wherein the bonding step includes adhering the solar cell to the surrogate substrate with a bonding material that is dissolvable in a solvent.

14. The method as defined in claim 13, wherein the surrogate substrate is selected from the group of sapphire, Ge, GaAs, or silicon.

15. The method as defined in claim 1, wherein the solar cell is eutectically bonded to the surrogate substrate.

16. The method as defined in claim 1, further comprising thinning the surrogate substrate to a predetermined thickness.

17. The method as defined in claim 1, further comprising:
mounting the solar cell on a support; and
removing the surrogate substrate.

18. The method as defined in claim 17, wherein the support is a rigid coverglass.

19. The method as defined in claim 1, wherein said first substrate is removed by grinding the first substrate to remove over 80% of its thickness, followed by an etching step to remove the remaining portion of the first substrate.

* * * * *